(12) United States Patent  
Lu et al.

(10) Patent No.: US 8,791,024 B1  
(45) Date of Patent: Jul. 29, 2014

(54) METHOD TO DEFINE MULTIPLE LAYER PATTERNS USING A SINGLE EXPOSURE

(71) Applicant: Taiwan Semiconductor Manufacturing Company, Ltd., Hsinchu (TW)

(72) Inventors: Yen-Cheng Lu, New Taipei (TW); Chih-Tsung Shih, Hsinchu (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/906,795

(22) Filed: May 31, 2013

Related U.S. Application Data

(60) Provisional application No. 61/823,312, filed on May 14, 2013.

(51) Int. Cl.  
*H01L 21/302* (2006.01)

(52) U.S. Cl.  
USPC .................. 438/708; 438/703; 257/E21.492

(58) Field of Classification Search  
USPC ................. 257/E21.222, E21.246, E21.487, 257/E21.492  
See application file for complete search history.

(56) References Cited

U.S. PATENT DOCUMENTS

| | | | |
|---|---|---|---|
| 5,230,772 A * | 7/1993 | Kadomura | 216/47 |
| 8,415,089 B1 | 4/2013 | Gupta et al. | |
| 2009/0219496 A1 * | 9/2009 | Kamm et al. | 355/53 |
| 2010/0297851 A1 * | 11/2010 | Bae et al. | 438/735 |

* cited by examiner

*Primary Examiner* — Cheung Lee  
(74) *Attorney, Agent, or Firm* — Haynes and Boone, LLP

(57) ABSTRACT

The present disclosure provides a method that includes forming a first photoresist layer on a substrate; forming a second photoresist layer over the first photoresist layer; and performing a lithography exposure process to the first photoresist layer and the second photoresist layer, thereby forming a first latent feature in the first photoresist layer and a second latent feature in the second photoresist layer.

27 Claims, 34 Drawing Sheets

METHOD TO DEFINE MULTIPLE LAYER PATTERNS USING A SINGLE EXPOSURE

BACKGROUND

This patent claims the benefit of U.S. Ser. No. 61/823,312 filed May 14, 2013, the entire disclosure of which is hereby incorporated by reference.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

ICs are commonly formed by a sequence of material layers, some of which are patterned by a photolithography process. It is important that the patterned layers properly align or overlay with adjacent layers. Proper alignment and overlay becomes more difficult in light of the decreasing geometry sizes of modern ICs. In addition, the surface topography of an underlying substrate, such as a semiconductor wafer, impacts the lithography imaging quality and further degrades the overlay tolerance between adjacent material layers. Furthermore, lithography processes are a significant contributor to the overall cost of manufacturing, including processing time and the cost of masks (also referred to as photomasks) used in the process. Therefore, what is needed is a lithography method to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

DETAILED DESCRIPTION

Figure 1:
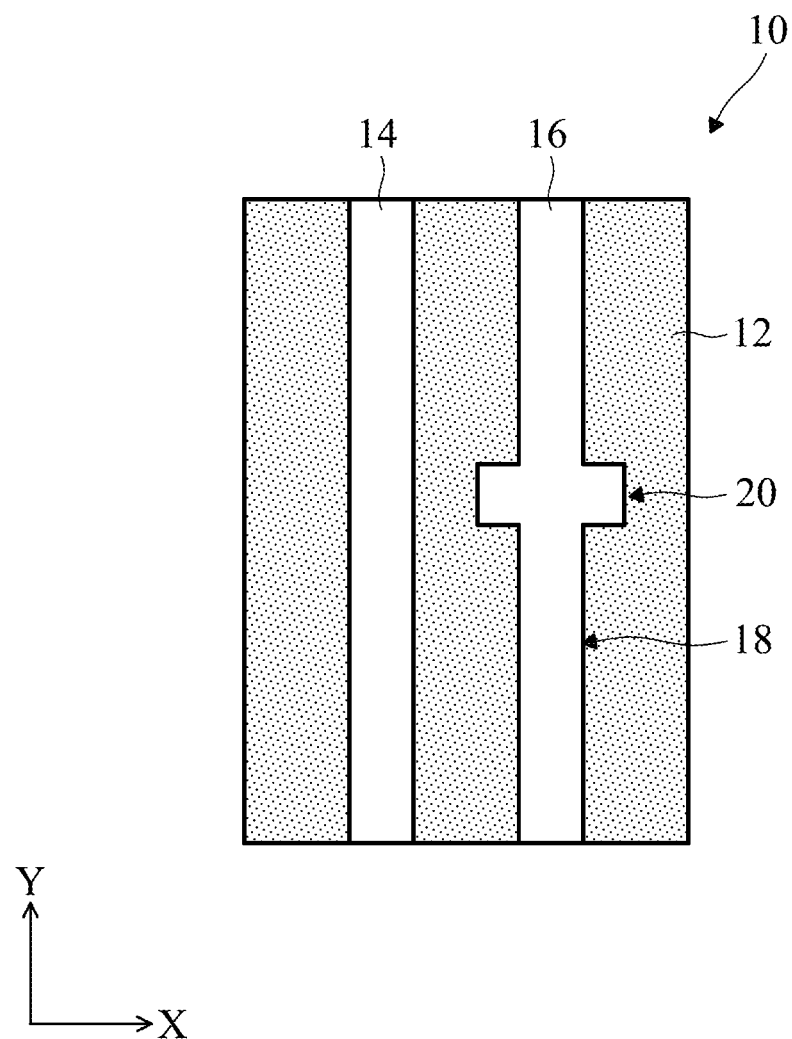
FIG. 1 is a top view of an example photomask constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a top view of a photomask (also referred to as mask or reticle) 10 having an integrated circuit (IC) design pattern constructed according to aspects of the present disclosure. It is understood that the photomask 10 and the included IC design may in fact be part of a larger, and more complicated photomask, not shown. The photomask 10 is used to pattern one or more layers during a lithography patterning process. The photomask 10 includes a photomask substrate 12 and the IC design pattern formed thereon. In the present example for illustration, the IC design pattern includes a first feature 14 and a second feature 16. In the present embodiment, the first feature 14 is a line feature oriented in a first direction (such as the Y direction in FIG. 1). The second feature 16 is a combined feature including a first portion 18 and a second portion 20. The first portion 18 is a line feature oriented in the first direction and the second portion 20 is intersected with the first feature 18. In the present embodiment, the second portion 20 extends in a second direction perpendicular to the first direction with a dimension greater than the corresponding dimension of the first portion 18. The first portion 18 is designed to form a first feature in one material layer on the wafer and the second portion 20 is designed to form a second feature in another material layer on the wafer. Particularly, two photoresist layers are exposed simultaneously in one lithography exposure process, such as ultraviolet (UV), deep ultraviolet (DUV) or extreme ultraviolet (EUV) lithography technique. In one example, the first feature 14 and the first portion 18 define metal lines and the second portion 20 defines a via feature.

Alternatively, the IC design pattern may be defined in a lithography patterning data file and be transferred to material (e.g., photoresist) layers by other exposing systems, such as a charged particle beam (including electron-beam), in a suitable mode (such as direct writing in raster mode or vector mode, or using a digital pattern generator). In e-beam lithography, the photoresist layers are often referred to as e-beam sensitive resist layers.

As will be described in detail below, the IC design pattern defined on the photomask 10 is used in a lithography process to simultaneously expose two photoresist layers coated on a substrate (such as a semiconductor wafer) to form two different patterns on the two photoresist layers, respectively. The two photoresist layers include a first photoresist layer and a second photoresist layer disposed over the first photoresist layer.

Figure 2A:
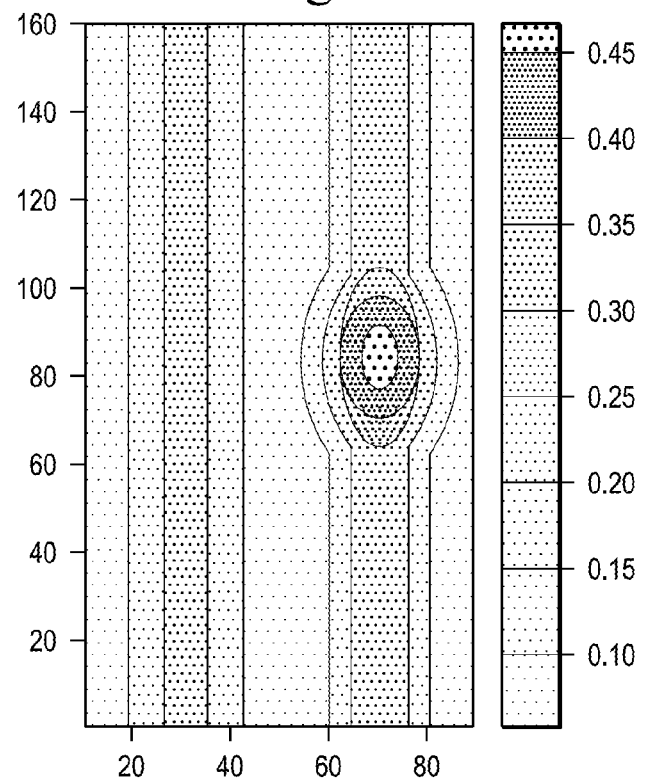
FIGS. 2a, 2b, 3 and 5 are diagrammatical views of various exposing intensity profiles during a lithography exposure process using the photomask of FIG. 1, according to one or more embodiments of the present disclosure.
Figure 2B:
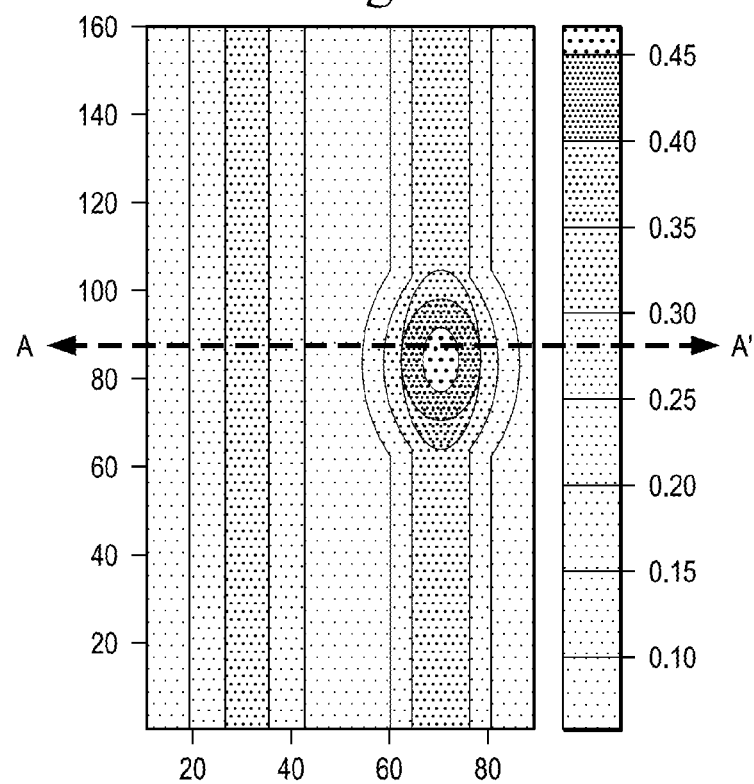
Figure 3:
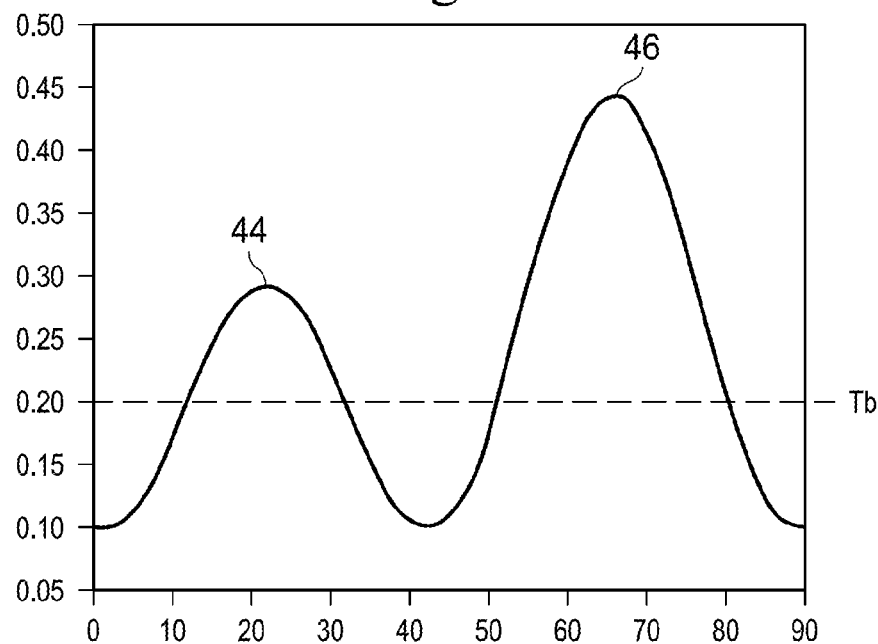

Referring to FIGS. 2a through 6, one way to describe the exposure of two photoresist layers 30 and 40 (FIGS. 5 and 6, respectively) is to consider exposure intensities for the two layers. FIG. 2a illustrates an exposure of the second (layer 30) photoresist layer, which is the upper of the two photoresist layers in the present embodiment. On the right side of FIG. 2a is an exposure intensity scale marked with various intensity levels. In the present example, the unit for the exposing intensity is a relative unit ranging from 0 to 1. In this case, "1" stands for 100% of the exposing intensity from the exposing system before reaching the photoresist layers. FIG. 3 graphically illustrates the exposure intensity distribution (vertical scale) across the width of the photoresist layer to be exposed (horizontal scale). In the present embodiment, the second photoresist layer 30 is selected such that it is responsive to exposure intensity above 0.2, illustrated by a line Tb in graph 3, and also shown in the exposure scale of FIG. 2a. As a result, the features 32 and 34 are formed in the photoresist 30.

Figure 5:
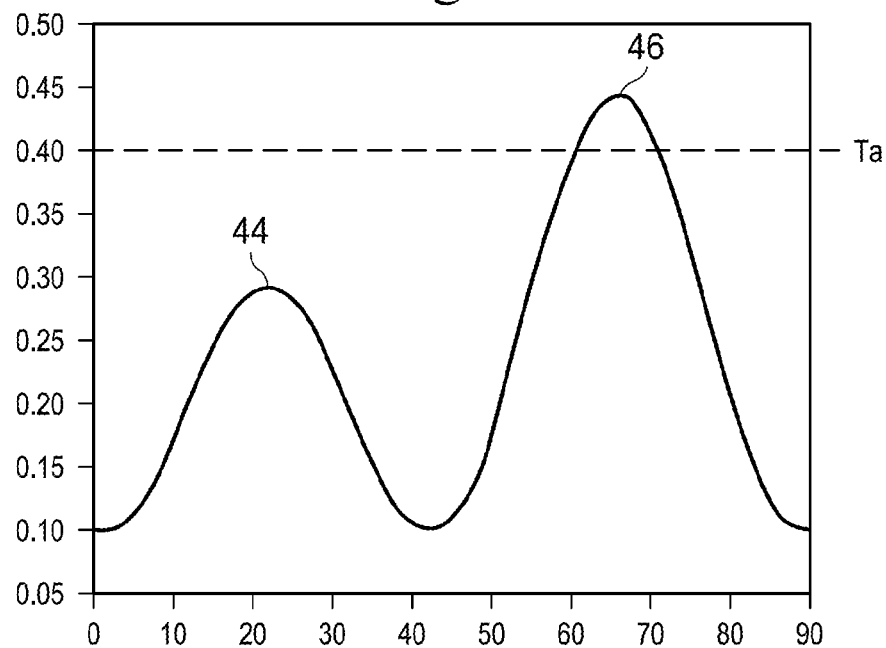

FIG. 2b illustrates an exposure of the first (layer 40) photoresist layer, which is the lower layer in the present embodiment. For the sake of example, the exposure intensity shown in FIG. 2b is the same as that in FIG. 2a, although such is not required in every embodiment. FIG. 5 is the same graph as FIG. 3, except there is a different line Ta. In the present embodiment, the first photoresist layer 40 is selected such that it is responsive to exposure intensity above 0.4, illustrated by the line Ta in the graph of FIG. 5, and also shown in the exposure scale of FIG. 2b. As a result, the feature 42 is formed in the photoresist 40.

Figure 6:
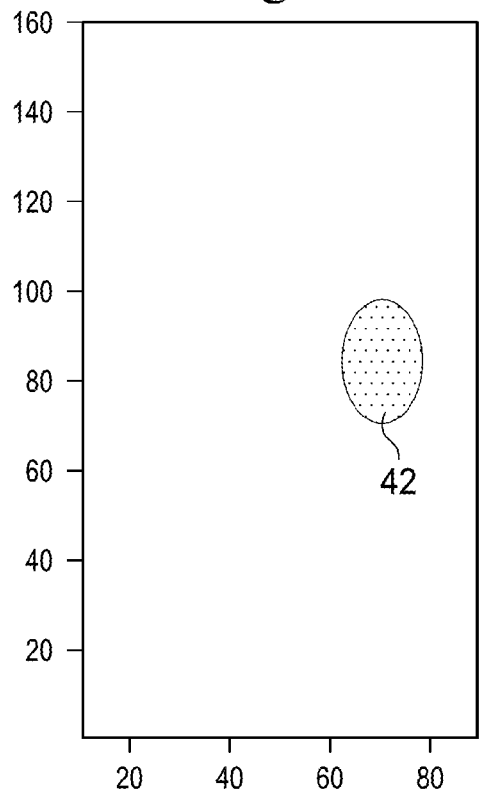

By the lithography exposure process with the pattern defined in the photomask 10, latent patterns are formed on the first and second photoresist layers, respectively. The latent pattern of a photoresist layer refers to the exposed pattern on the photoresist layer, which eventually becomes a physical photoresist pattern, such as by a developing process. In the present case, the latent patterns illustrated in FIGS. 4 and 6 are corresponding images of the exposed portions with exposing intensity equal to or greater than the respective exposure threshold.

Figure 4:
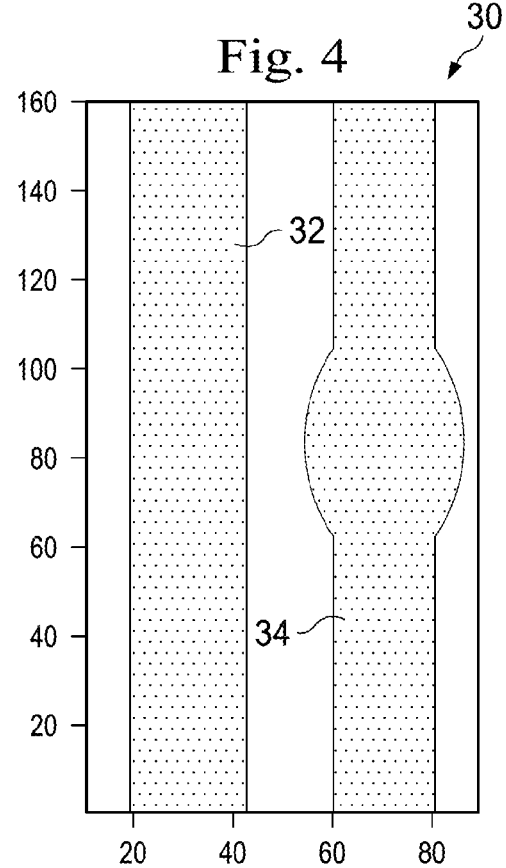
FIGS. 4 and 6 are top views of latent photoresist patterns in respective photoresist layers constructed using the photomask of FIG. 1 and according to one or more embodiments of the present disclosure.

In the present embodiment, the latent pattern on the second photoresist layer 30, as illustrated in FIG. 4, includes a first feature 32 and a second feature 34. The latent pattern on the first photoresist layer 40, as illustrated in FIG. 6, includes one feature 42. The latent pattern on the second photoresist layer 30 and the latent pattern on the first photoresist layer 40 are different from each other. Therefore, by one exposure process, two photoresist layers are exposed with respective patterns. This is further explained below.

Each photoresist material has its respective exposure threshold to radiation (for example an exposing beam of an EUV system). When the exposing intensity (also referred to as exposing dosage) is equal to or greater than the exposure threshold, the corresponding portion of the photoresist is chemically changed such that it will be developed (e.g., it is removed by the developer when the photoresist is positive tone) in a developing process. When the exposing intensity is less than the exposure threshold, the corresponding portion of the photoresist is not chemically changed to be developed (e.g., it remains during the developing process when the photoresist is positive tone). It is understood that the term "changed" means that the photoresist has sufficiently changed to respond differently, e.g., as exposed positive-tone photoresist responds in the development process. In one example where the photoresist is positive tone, only portions of the photoresist exposed with exposing intensity equal to or greater than the exposure threshold are removed by a suitable developer during the developing process. Other portions of the photoresist unexposed or exposed with exposing intensity less than the exposure threshold remain after the developing process.

In another example where the photoresist is negative tone, the portions of the photoresist unexposed or exposed with exposing intensity less than the exposure threshold are removed by a suitable developer during the developing process. Other portions of the photoresist exposed with exposing intensity equal to or greater than the exposure threshold remain after the developing process.

In the present embodiment, the first and second photoresist layers are both positive tone. During the lithography exposure process using the photomask 10, both the first and second photoresist layers are exposed to form respective latent patterns as illustrated in FIGS. 6 and 4, respectively, due to one or more factors.

In one embodiment, the first photoresist layer and the second photoresist layer are designed to have different exposure thresholds. The first photoresist layer has a relatively high exposure threshold and the second photoresist layer has a relatively low exposure threshold, i.e., less than that of the first photoresist layer. Therefore, the first feature 14 and the second feature 16 in the photomask 10 are both imaged to the second photoresist layer 30 to form the second latent pattern that includes a first latent feature 32 and a second latent feature 34. Since the second feature 16 includes the second portion 20 overlapped with the first portion 18, therefore, the second latent feature 34 has a portion extending out as illustrated in FIG. 4.

As to the first photoresist layer 40, since it has a higher exposure threshold, the first latent pattern formed thereon by the lithography exposure process is different from that of the second photoresist layer 30. FIG. 3 illustrates the exposing intensity along the A-A' line with a first peak 44 associated with the first feature 14 and a second peak 46 associated with the second portion 20. The exposure threshold for the first photoresist layer 40 is chosen to be greater than the maximum exposing intensity of the first peak 44 and lower than the maximum exposing intensity of the second peak 46. Thus, the first feature 14 and the first portion 18 of the second feature 16 defined in the photomask 10 are not imaged to the first photoresist layer 40. The second portion 20 of the second feature 16 is imaged to the first photoresist layer 40 by the lithography exposure process, thereby forming the latent feature 42 as illustrated in FIG. 6. By properly choosing various dimensions (dimensions on mask or DOM) of the IC design pattern defined in the photomask 10, the first and second latent patterns are formed on the respective photoresist layer with proper dimensions (dimensions on wafer or DOW) in best focus (BF). In the present example, the first feature 14 and the first portion 18 are tuned according to a first size bias to form the latent pattern in the second photoresist layer with proper dimensions. The second portion 20 is tuned with a second size bias different from the first size bias to form the corresponding latent pattern in the first photoresist layer with proper dimensions.

In another embodiment, an attenuation mechanism is provided such that the exposing intensity to the first photoresist layer is less than the exposing intensity to the second photoresist layer to form different latent patterns on respective photoresist layers. In this embodiment, the exposure threshold to the first photoresist layer may be chosen as same as that of the second photoresist layer or alternatively different. In one example, the second photoresist layer attenuates the exposing light such that only a portion of the exposing beam reaches to the first photoresist layer. In another example, an attenuating material layer is inserted between the first and second photoresist layers. The attenuating material layer absorbs the exposing light such that the exposing beam reaching the first photoresist layer 40 is only a portion of the exposing light projected on the second photoresist layer 30. Thus the exposing intensity to the first photoresist layer 40 is less than the exposing intensity to the second photoresist layer 30. Accordingly, based on the exposing intensity and the exposure threshold, the latent pattern on the first photoresist layer 40 is different from the latent pattern formed on the second photoresist layer 30. Particularly, when the first exposure threshold associated with the first photoresist layer is greater than the maximum exposing intensity of the first peak 44 and lower than the maximum exposing intensity of the second peak 46, the first feature 14 and the first portion 18 of the second feature 16 defined in the photomask 10 are not imaged to the first photoresist layer 40. The second portion 20 of the second feature 16 is imaged to the first photoresist layer 40 by the lithography exposure process, thereby forming the latent feature 42 as illustrated in FIG. 6. As a comparison, the second exposure threshold associated with the second photoresist layer is lower than both the maximum exposing intensity of the first peak 44 and the maximum exposing intensity of the second peak 46, both the first feature 14 and the second feature 16 defined in the photomask 10 are imaged to the second photoresist layer 30.

In various embodiments, by properly choosing the exposure threshold through tuning of the photoresist materials, choosing the exposing intensity through various attenuation mechanisms (photoresist or inserting an attenuating material layer), adjusting various dimensions of the IC design pattern, or a combination thereof, the different patterns can be formed on respective photoresist layers with proper dimensions.

Thereafter, the two photoresist layers are developed to form a first photoresist pattern in the first photoresist layer and a second photoresist pattern in the second photoresist layer. Other manufacturing operations follow to transfer the two photoresist patterns to the substrate. In one example, one or more etch operations are implemented to transfer the two photoresist patterns to respective underlying material layers on the substrate.

By the disclosed method, two photoresist layers are simultaneously exposed to form respective patterns by one lithography exposure process. Therefore, both the manufacturing cost and manufacturing cycle time are reduced. Other benefits may present in various embodiments.

In one embodiment, the two photoresist patterns, therefore, the two respective pattern transferred to the underlying material layers, are intrinsically aligned since they are printed from the same IC design pattern.

In the present embodiment, the lithography exposure process uses photons, such UV, DUV or EUV, a photomask is used and the IC design pattern is defined in the photomask. In this case, only one photomask is used to form two different patterns in two respective photoresist layers. The number of photomasks used in the lithography exposure processes is reduced and the associated photomask cost is reduced.

In another embodiment, charged particles are used as radiation beam during the lithography exposure process. In this case, the IC design pattern may be defined in a data file and the sensitive resist material is chosen to be sensitive to the charged particles, such as e-beam.

The method to simultaneously pattern two photoresist layers and the semiconductor structure made thereby are further described below according to various embodiments.

Figure 7:
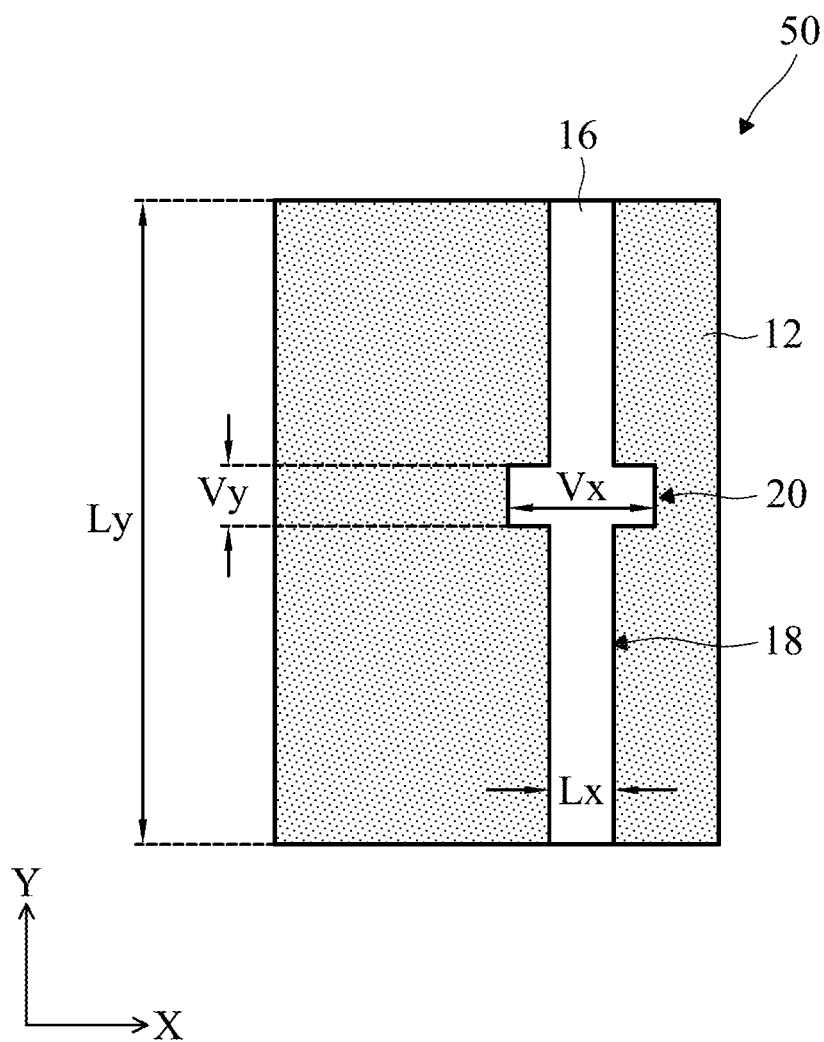
FIG. 7 is a top view of the photomask of FIG. 1, in portion.

FIG. 7 is a top view of a photomask portion 50 of the photomask 10 (FIG. 1, which itself may be a portion of a larger photomask) having an IC design pattern constructed according to aspects of the present disclosure in one embodiment. The photomask 50 includes a photomask substrate 12 and the IC design pattern formed thereon. In one embodiment, such as UV and DUV lithography technologies, the photomask substrate 12 includes a transparent substrate, such as fused quartz. An IC pattern is formed on the photomask substrate 12 and is defined in an opaque material layer, such as chromium (Cr).

In another embodiment, such as EUV technology, the photomask 50 is a reflective photomask. An exemplary reflective mask may include a substrate 12 of a low thermal expansion material (LTEM). A reflective multilayer (ML) is deposited on the substrate, and an absorber layer is deposited over the reflective ML and is further patterned to define the IC pattern. It is understood that other configurations and inclusion or omission of various items may be possible. For example, a capping layer may be formed between the reflective ML and absorber layer. In another example, a protection layer may be formed on the absorber layer.

In other embodiments, the photomask 50 may be a phase shift mask (PSM), such as attenuating PSM or alternating PSM, for enhanced imaging resolution.

In the present embodiment, the IC design pattern 16 includes a first feature 18 and a second feature 20 intersecting with the first feature 18. The first feature 18 and second feature 20 are designed to form a first integrated circuit feature (also referred to as first main feature) in a first material layer on a circuit substrate (such as a semiconductor wafer). The second feature 20 is also designed to form a second integrated circuit feature (also referred to as second main feature) in a second material layer on the circuit substrate. The second material layer is underlying the first material layer.

The first feature 18 is a line feature oriented in the Y direction. In the present embodiment, the IC design pattern 16 is designed to form a portion of an interconnect structure. In furtherance of the embodiment, the first feature 18 is designed to form a metal line in the circuit substrate. The second feature 20 is designed to form a via feature to connect and electrically couple the metal line to another metal line in a metal layer below the via. Alternatively, the second feature 20 is designed to form a contact feature to connect and electrically couple the metal line to a gate electrode or a doped semiconductor feature (such as source or drain) in the circuit substrate.

The second feature 20 extends in the X direction with a dimension greater than the corresponding dimension of the first feature 18. Particularly, the first feature 18 spans with dimensions Lx in the X direction and Ly in the Y direction. The second feature 20 spans with dimensions Vx in the X direction and Vy in the Y direction. In the present embodiment, Ly is greater than Vy and Lx is less than Vx. In furtherance of the embodiment, the second feature 20 and the first feature 18 are aligned to be co-centered in the X direction.

For the sake of example, the following discussion will describe using the photomask 50 of FIG. 7 in a semiconductor structure 100, shown in various fabrication stages in FIGS. 8 through 19.

Figure 8:
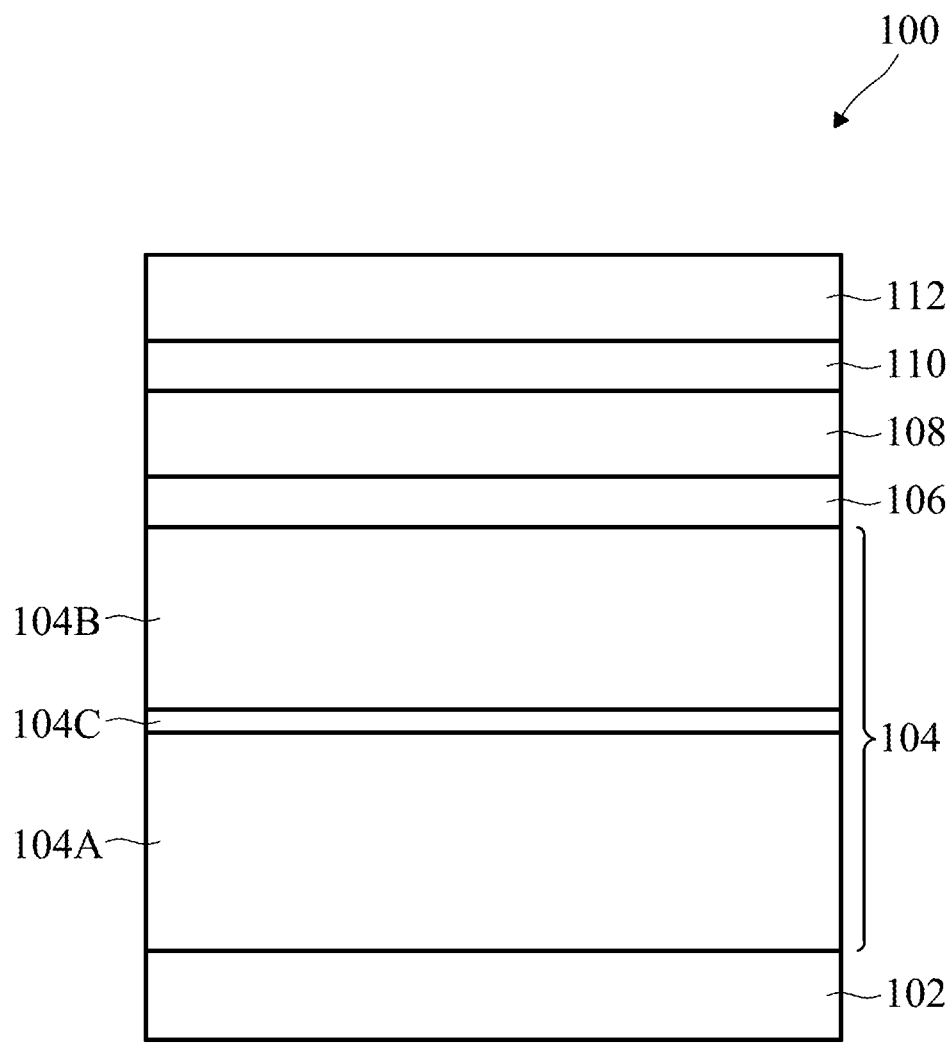
FIGS. 8 through 19 are sectional views of a semiconductor structure at various fabrication stages constructed according to one or more embodiments of the present disclosure and using the photomask of FIG. 1.

Referring to FIG. 8, a semiconductor substrate 102 is provided. In the present embodiment, the semiconductor substrate 102 includes silicon. Alternatively, the substrate 102 includes germanium, silicon germanium or other suitable semiconductor material, such as diamond, silicon carbide or gallium arsenic. The substrate 102 may further include additional features and/or material layers, such as various isolation features formed in the substrate. The substrate 102 may include various p-type doped regions and/or n-type doped regions configured and coupled to form various devices and functional features. All doping features may be achieved using a suitable process, such as ion implantation in various steps and techniques. The substrate 102 may include other features, such as shallow trench isolation (STI) features. The substrate 102 may also include a portion of an interconnect structure that includes metal lines in various metal layers, via features to provide vertical connection between the metal lines in the adjacent metal layers, and contact features to provide vertical connection between the metal lines in the first metal layer and various device features (such as gates, sources and drains) on the substrate.

Still referring to FIG. 8, various material layers are formed on the substrate 102. In the present embodiment, a dielectric material layer 104 is formed on the substrate 102. The dielectric material layer 104 may include plurality of dielectric films. In the present embodiment, the dielectric material layer 104 includes a first interlayer dielectric (ILD) material 104A formed on the substrate 102. The first ILD material layer 104A includes a dielectric material, such as silicon oxide, low k dielectric material, other suitable dielectric material or combination thereof.

The dielectric material layer 104 includes a second ILD material layer 104B formed over the first ILD material layer 104A. The second ILD material layer 104B is similar to the first ILD material layer 104A in terms of composition and formation. For example, the second ILD material layer 104B includes a dielectric material, such as silicon oxide, low k dielectric material, other suitable dielectric material or combination thereof.

The dielectric material layer 104 includes an etch stop layer 104C formed between the first and second ILD material layers. The etch stop layer 104C has an etch selectivity to the ILD material and functions to stop etch during subsequent operation to pattern the ILD material layers. The etch stop layer 104C is different from the ILD material in composition and includes another dielectric material, such as silicon nitride, silicon oxynitride or silicon carbide. Various dielectric materials may be deposited by a suitable technique, such as chemical vapor deposition (CVD), spin-on coating or other suitable method.

Two photoresist layers are subsequently formed on the dielectric material layer 104. Specifically, a first photoresist layer 108 is formed over the dielectric material layer 104. The first photoresist layer 108 is formed by spin-on coating or other suitable technique. A second photoresist layer 112 is formed over the first photoresist layer 108. The second photoresist layer 112 is formed by spin-on coating or other suitable technique. Other steps, such as baking, may follow the coating of each photoresist layer. The first and second photoresist layers may have similar or different compositions from each other, according to various embodiments.

In one embodiment, the second photoresist layer 112 is different from the first photoresist layer 108 and is formed directly on the first photoresist layer 108. The first and second photoresist layers are configured to be exclusively dissolved in separate, respective developers. Specifically, a first developer is used to develop the first photoresist layer 108 and a second developer is used to develop the second photoresist layer 112. The first developer is different from the second developer. The first photoresist layer is dissoluble in the first developer but indissoluble in the second developer. The second photoresist layer is dissoluble in the second developer but indissoluble in the first developer. In one example, the first and second photoresist layers are chosen to have different exposure thresholds. In another example, the second photoresist layer 112 attenuates the exposing beam during the lithography exposure process such that the exposing beam projected on the second photoresist layer 112 is partially absorbed and only a portion of the exposing beam reaches the first photoresist layer 108. Thus the exposing intensities to the first and second photoresist layers are different. Specifically, the exposing intensity to the first photoresist layer 108 is less than the exposing intensity to the second photoresist layer 112. In this case, the exposure thresholds of the first and second photoresist layers may be chosen to be the same, or different. In another example, the first photoresist layer 108 has a thickness ranging between about 40 nm and about 60 nm. In another example, the second photoresist layer 112 has a thickness ranging between about 20 nm and about 40 nm.

In another embodiment, a material layer 110 is formed between the first and second photoresist layers. In this embodiment, the two photoresist layers may be same in composition or different. The material layer 110 is inserted therebetween to serve one or more functions. In one example, the material layer 110 separates the first and second photoresist layers from each other if those two photoresist layers are mutually dissoluble to a same developer. In another example, the material layer 110 functions to absorb the exposing beam such that the exposing beam projected on the second photoresist layer 112 is partially absorbed and only a portion of the exposing beam reaches the first photoresist layer 108. Thus the exposing intensity to the first photoresist layer 108 is less than the exposing intensity to the second photoresist layer 112. In another example, the material layer 110 functions as a hard mask during subsequent operations to pattern the dielectric material layer 104. The material layer 110 is formed on the first photoresist layer 106 before the coating of the second photoresist layer 112.

The material layer 110 includes a dielectric material, such as aluminum oxide ($Al_2O_3$), silicon oxide ($SiO_2$), silicon nitride (SiN), titanium oxide (TiO), or other suitable material. The material layer 110 is formed by spin-on coating or low temperature deposition without damage to the underlying photoresist layer 108. For example, the material layer 110 of aluminum oxide is deposited by spin-on coating. In another example, the material layer 110 of silicon oxide, silicon nitride, or titanium oxide, is formed by a low temperature deposition, such as CVD at low temperature. In one example, the material layer 110 has a thickness ranging between about 10 nm and about 20 nm.

In another embodiment, a second material layer 106 is formed between the dielectric material layer 104 and the first photoresist layer 108. In the present embodiment, the second material layer 106 functions as a hard mask layer during the subsequent operations to pattern the dielectric material layer 104. The second material layer 106 may be different from the material layer 110 or alternatively same. For example, the second material layer 106 may include aluminum oxide. The second material layer 106 is formed on the dielectric material layer 104 before the coating of the first photoresist layer 108. The second material layer 106 may include one or more films to enhance the operations of patterning the dielectric material layer 104.

Figure 9:
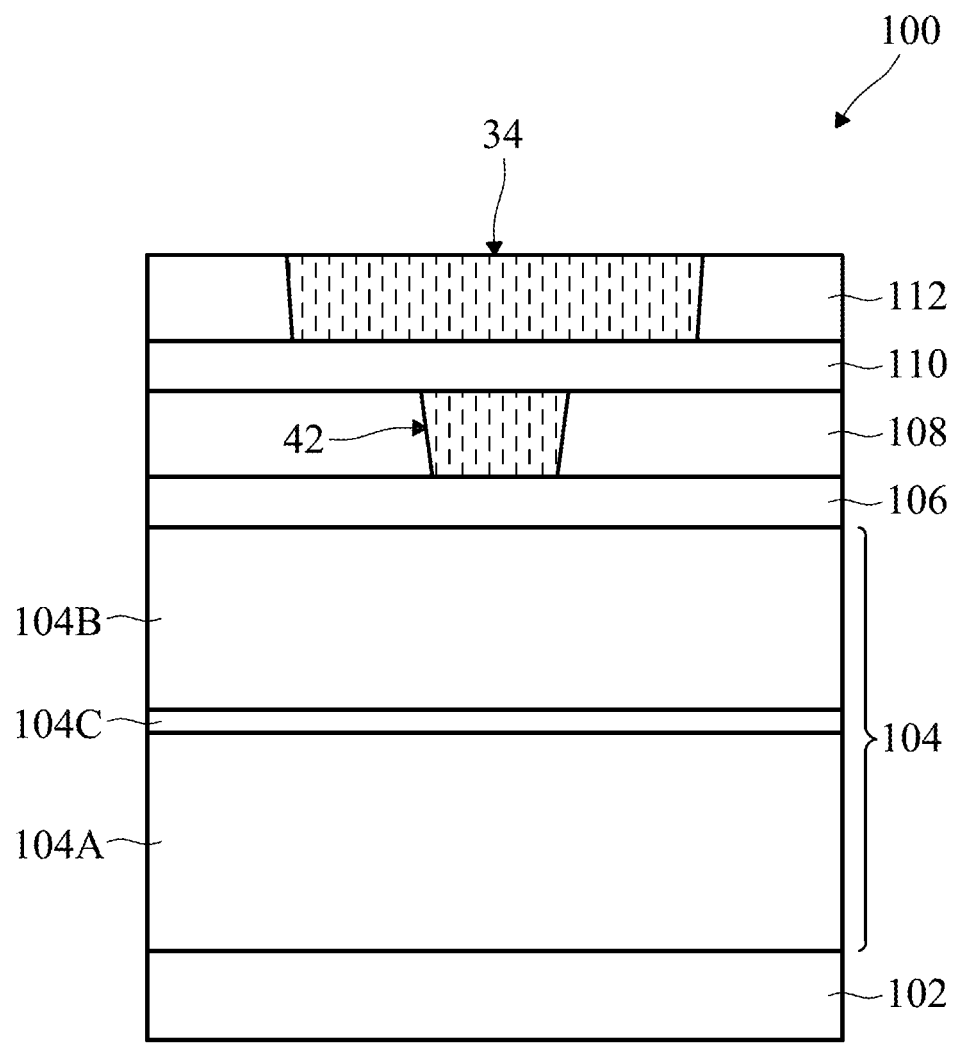

Referring to FIG. 9, a lithography exposure process is implemented using the photomask 50 to simultaneously expose both the first and second photoresist layers, thereby forming latent patterns on respective photoresist layers. During the lithography exposure process, the IC design pattern defined in photomask 50 is imaged to the second photoresist layer 112 and the first photoresist layer 108. A first latent pattern is formed in the first photoresist layer 108 and a second latent pattern is formed in the second photoresist layer 112. A latent pattern is referred to as a portion of the photoresist layer that is exposed but not developed yet. The first and second latent patterns are different from each other due to different exposing intensities, different exposure thresholds or both, as described above with reference to FIGS. 1 through 6. However, the first and second latent patterns are related since both are images of the same IC pattern defined on the photomask 50. This will be further described later when referring to other figures. In the present example, the first latent pattern includes a first latent feature 42 associated with the via feature 20 and the second latent pattern includes a second latent feature 34 associated with the metal line features 18 and the via feature 20 defined in the photomask 50. The top views of the latent features 42 and 34 are described with reference to FIGS. 4 and 6, as noted above with respect to the photomask 10.

The lithography exposure process may be of various types as known in the art, including exposure systems that utilize krypton fluoride (KrF) excimer lasers, argon fluoride (ArF) excimer lasers, ArF immersion lithography, or EUV. Other operations, such as post-exposure-baking (PEB), may follow the lithography exposure process.

Figure 10:
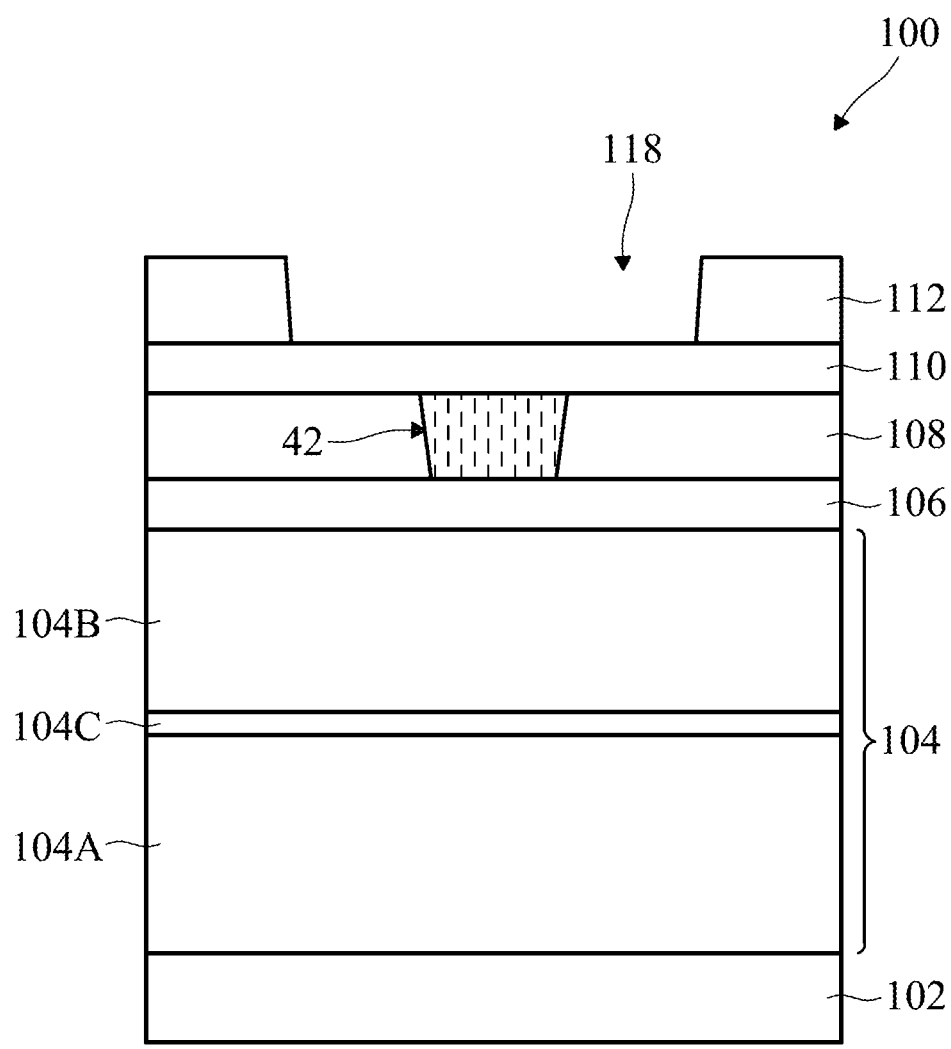

Referring to FIG. 10, the second photoresist layer 112 is developed by the corresponding developer. In the present embodiment, both the first and second photoresist layers are positive tone. The exposed portion (the second latent feature 34) is removed in the developer, thereby forming a patterned second photoresist layer having an opening 118 associated with the second latent feature 34. Other operations, such as hard baking, may follow the developing process.

Figure 11:
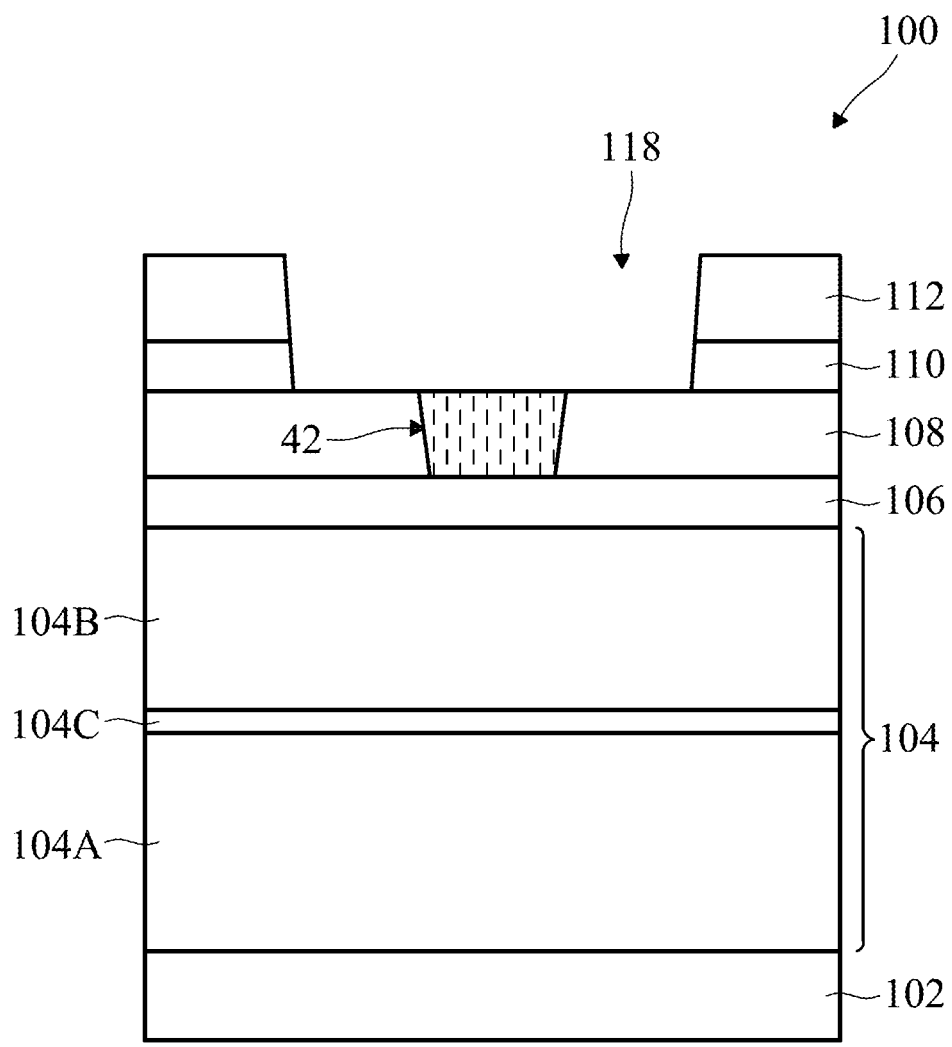

Referring to FIG. 11, an etch process is applied to selectively etch the material layer 110 and remove the portion of the material layer 110 aligned within the opening 118. The etch process and the etchant are properly chosen for selective etch without damage to the photoresist.

Figure 12:
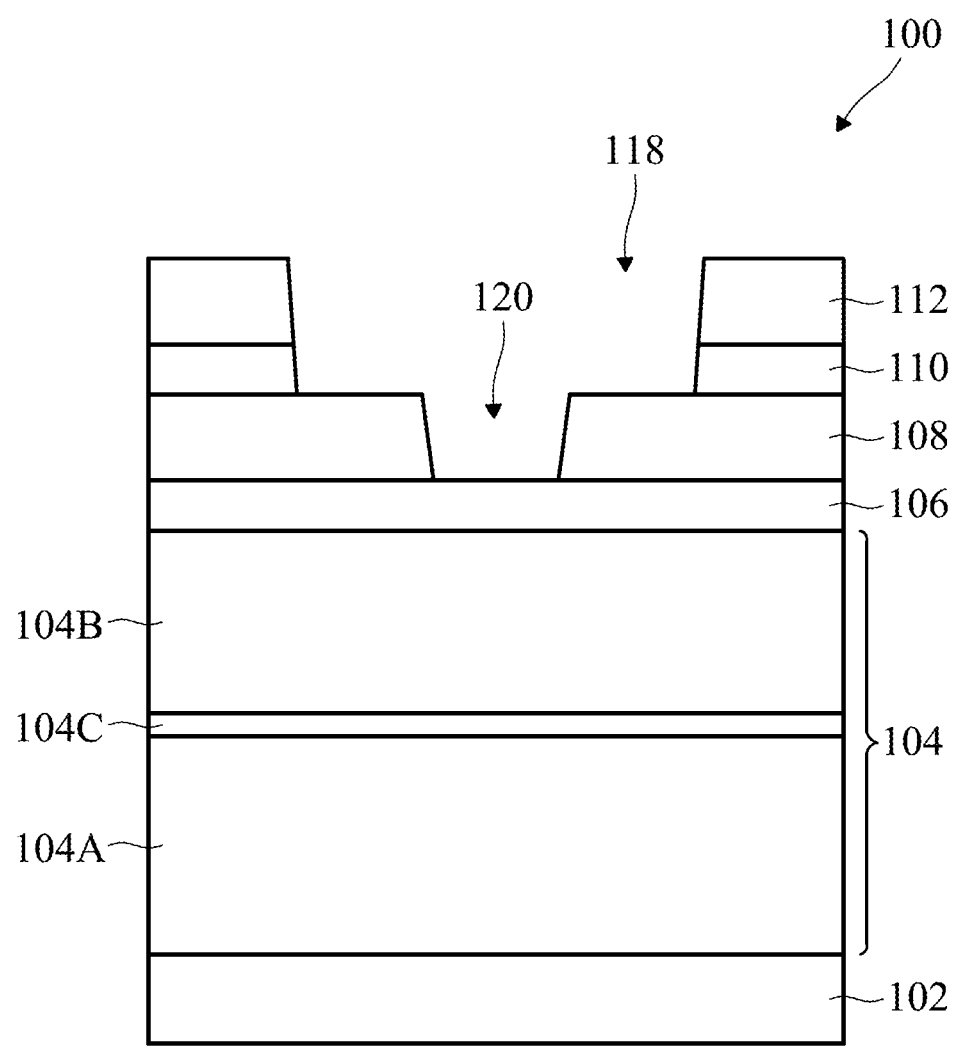

Referring to FIG. 12, the first photoresist layer 108 is developed by the corresponding developer. In the present embodiment, the first photoresist layer is positive tone. The exposed portion (the first latent feature 42) is removed in the developer, thereby forming a patterned first photoresist layer having an opening 120 associated with the first latent feature 42. Other operations, such as hard baking, may follow the developing process.

Figure 13:
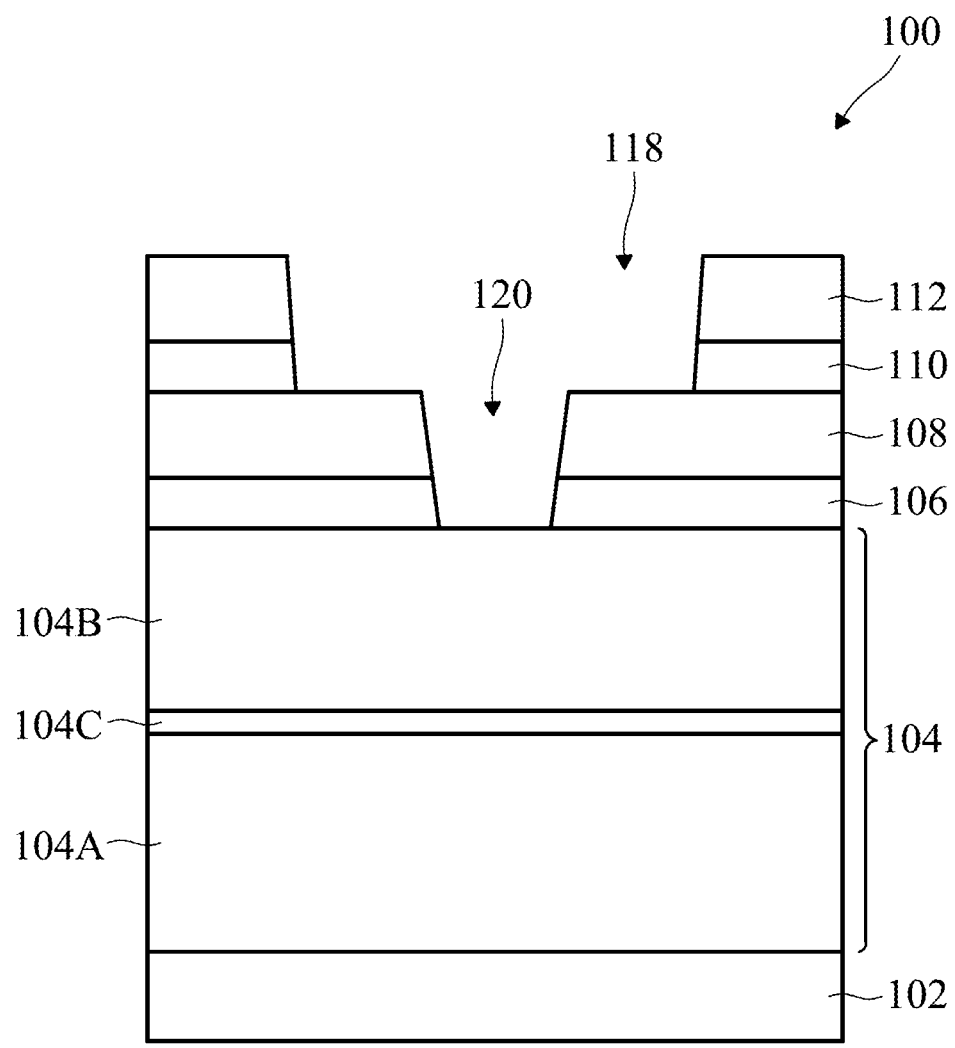

Referring to FIG. 13, another etch process is applied to selectively etch the second material layer 106 and removes the portion of the second material layer 106 aligned with the opening 120 uncovered by the patterned first photoresist layer 106. The etch process and the etchant are properly chosen for selective etch without damage to the photoresist.

Figure 14:
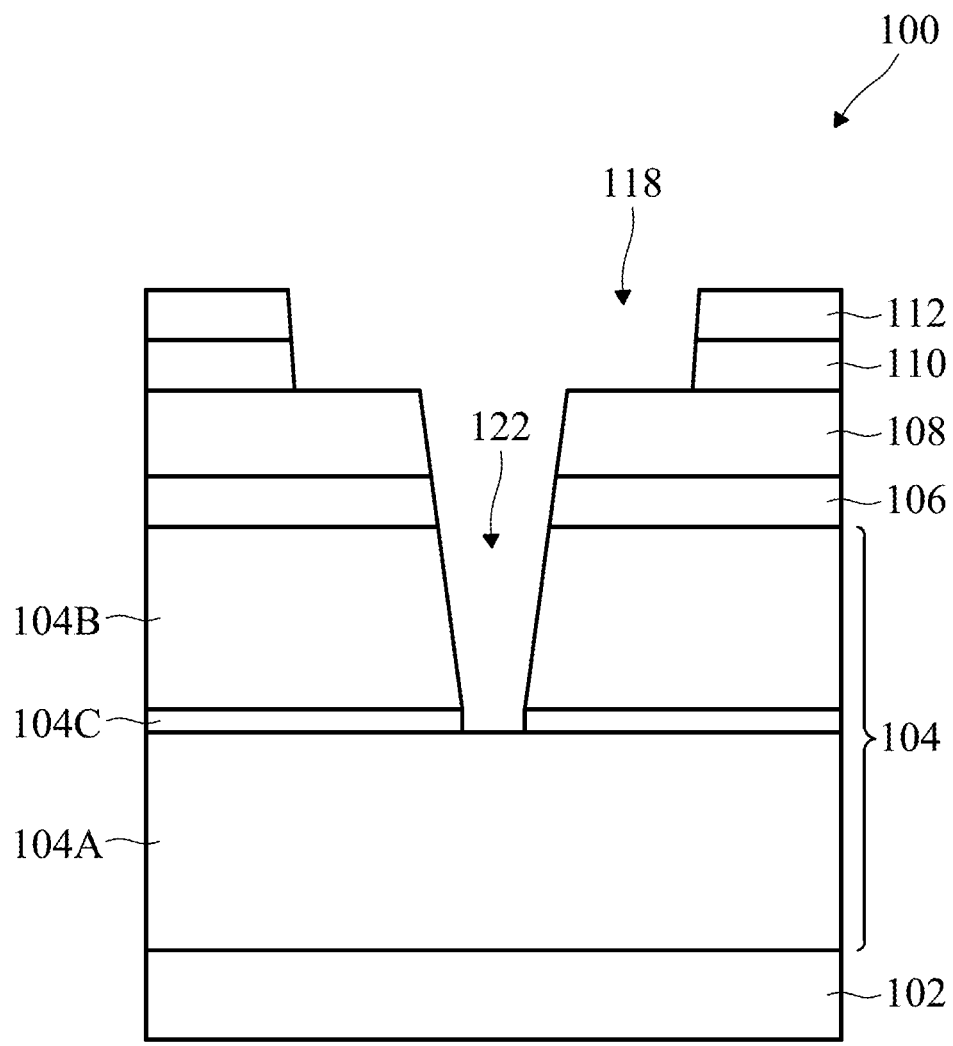

Referring to FIG. 14, an etch process is applied to selectively etch the second ILD material layer 104B within the opening 120, thereby forming a trench 122 in the second ILD material layer 104B. The etch process stops on the etch stop layer 104C. The etch process is properly chosen to form the trench 122. For example, dry etch, wet etch, or a combination thereof, may be applied for transferring the opening 120 to the second ILD material layer 104B, forming the trench 122.

Figure 15:
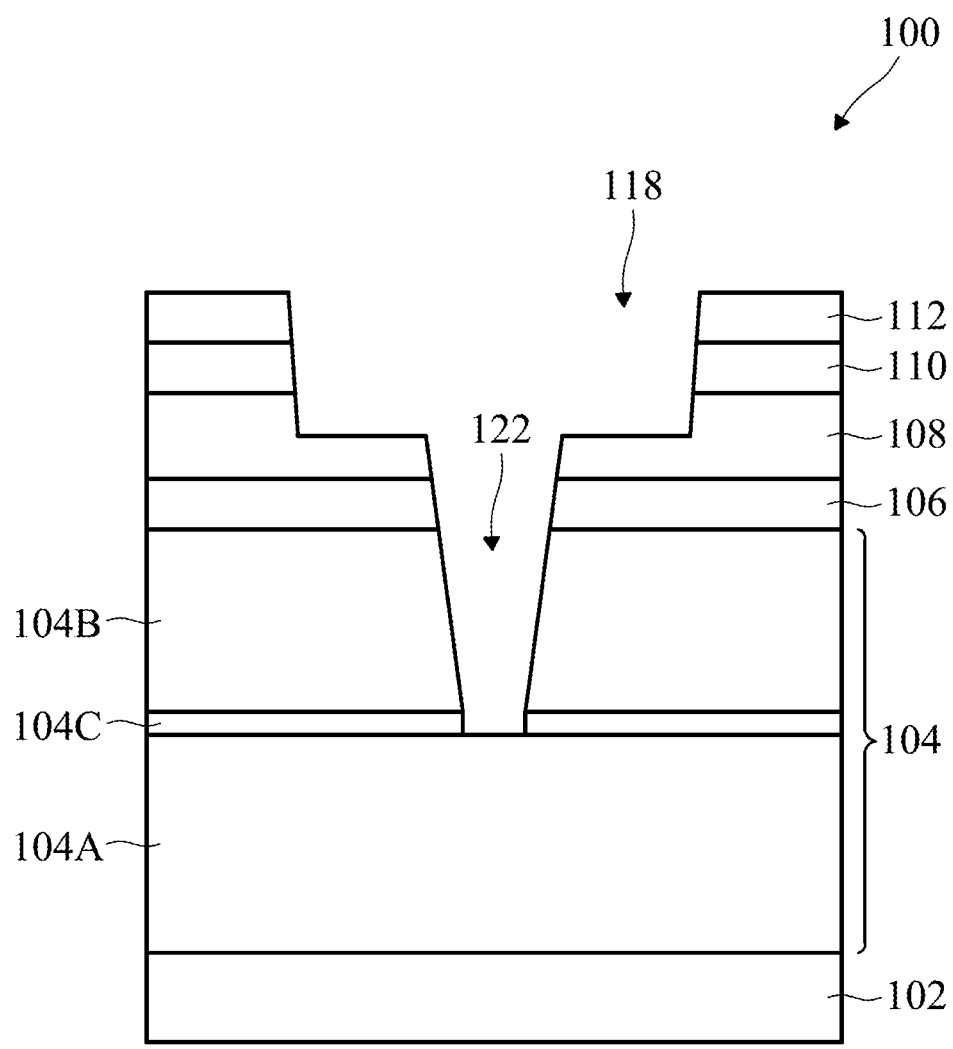

Referring to FIG. 15, another etch process is applied to selectively etch the etch stop layer 104C within the trench 122. The etch process is properly chosen to form the trench 122. In one embodiment, a wet etch may be applied to open the etch stop layer 104C. For example where the etch stop layer 104C includes silicon oxide, a hydrofluoride (HF) may be used as etchant to etch the etch stop layer 104C.

Figure 16:
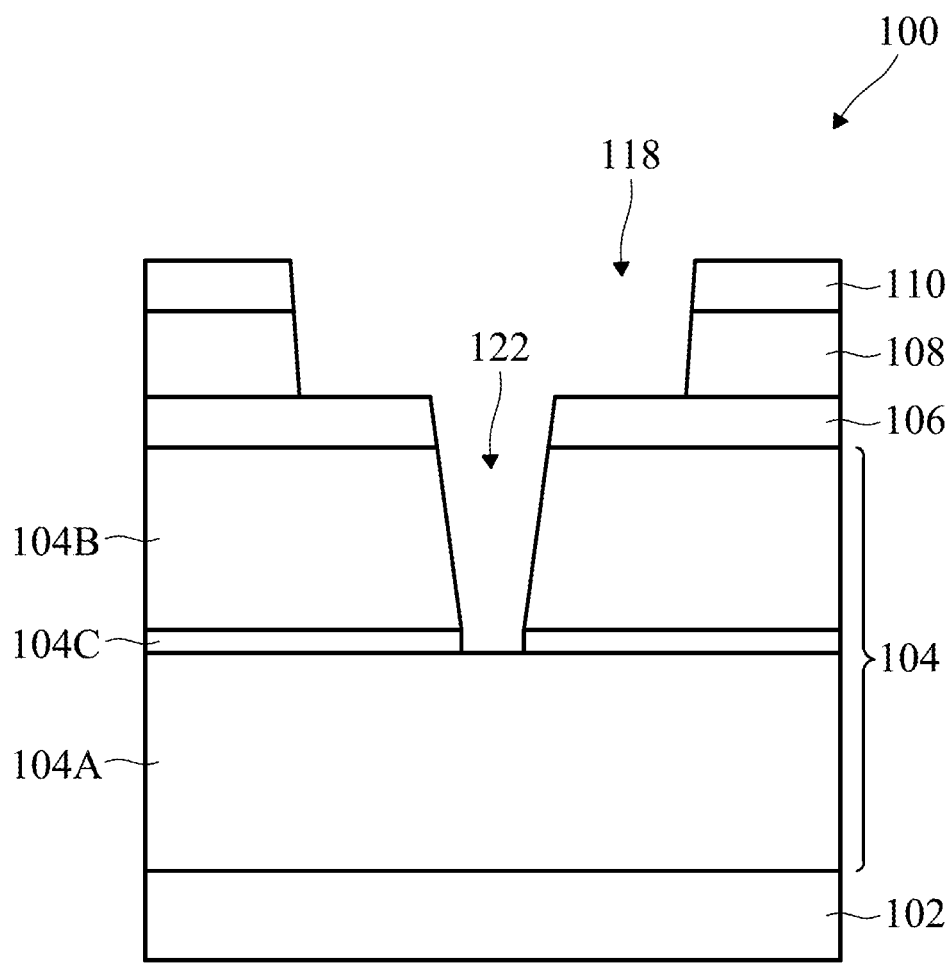

Referring to FIG. 16, a trimming process is applied to trim the photoresist layer 112, thereby transferring the opening 118 from the second photoresist layer 112 to the first photoresist layer 108. The second photoresist layer 112 and an uncovered portion of the first photoresist layer 108 are removed by the trimming process. In one embodiment, the trimming process is similar to a photoresist strip process. For example, the trimming process implements wet stripping.

Figure 17:
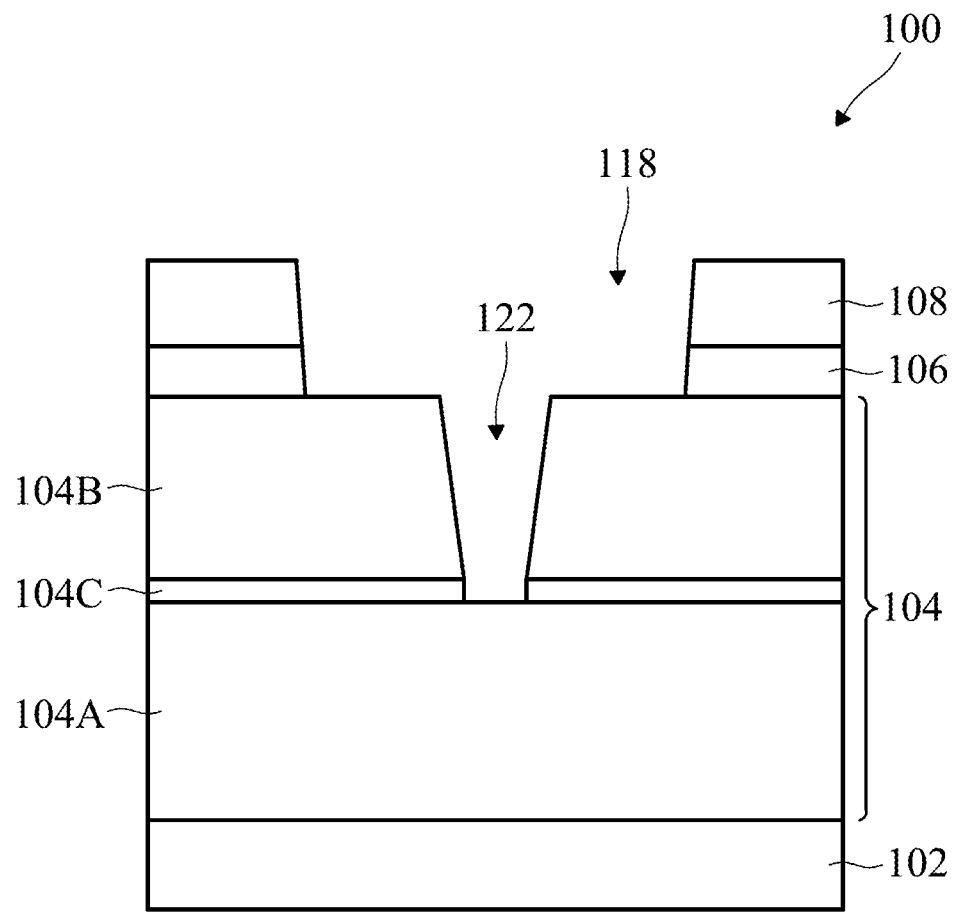

Referring to FIG. 17, an etch process is applied to etch the second material layer 106 within the opening 118, thereby transferring the opening 118 to the second material layer 106. In one embodiment, the second material layer 106 and the material layer 110 includes a same material (such as aluminum oxide), the etch process opens the second material layer 106 and removes the material layer 110 as well.

Figure 18:
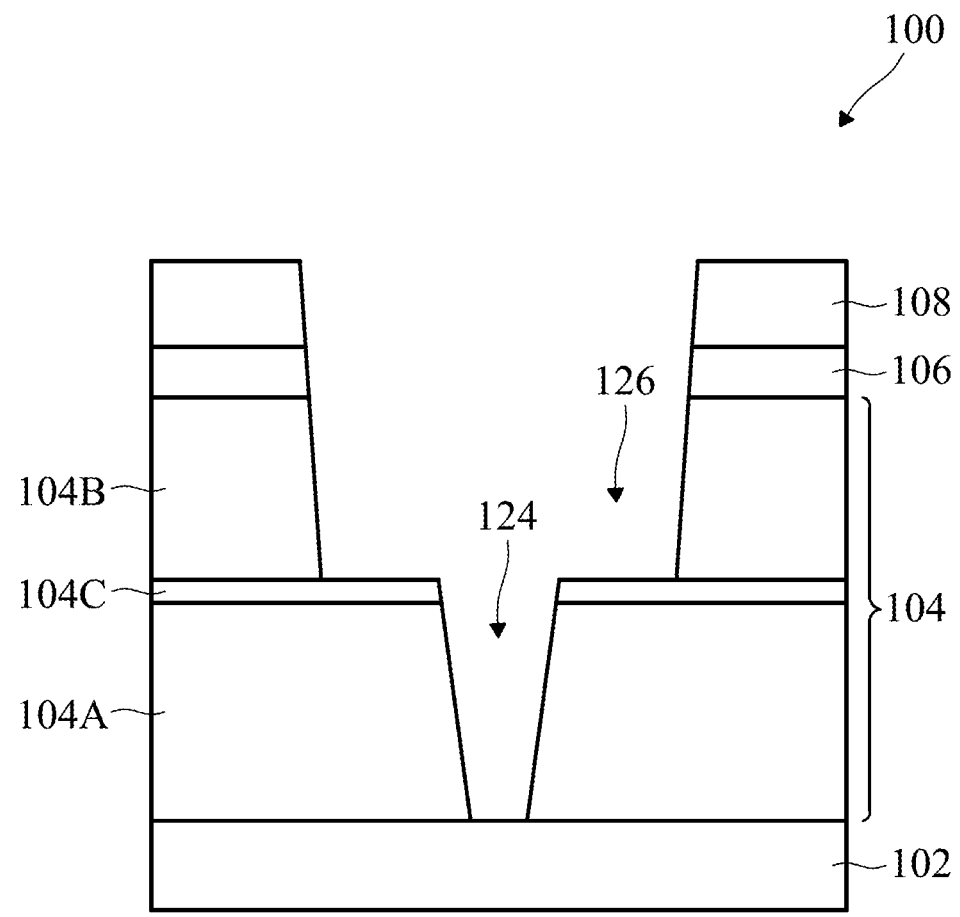

Referring to FIG. 18, another etch process is applied to selectively etch both the first ILD material layer 104A and the second ILD material layer 104B using the second material layer 106 as an etch mask, thereby forming a first trench 124 for the via feature in the first ILD material layer 104A and a second trench 126 for the metal line in the second ILD material layer 104B. In the present embodiment, the first and second ILD material layers include a same dielectric material. The etch process recesses both the first and second ILD material layers. The etch process is properly chosen for selective etch. For example, dry etch may be applied to form the via trench 124 and metal line trench 126 in respective ILD material layers.

In some embodiments, another etch stop layer is disposed between the substrate 102 and the first ILD material layer 104A such that the etch process properly stops on the etch stop layer. In this case, the etch stop layer can be subsequently opened by another etch for proper electrical connection. In another embodiment, an underlying metal layer is formed below the first ILD material layer and the via trench 126 is properly aligned with the underlying metal line for electrical connection. Other operations may be subsequently implemented. For example, the first photoresist layer 108 may be removed by wet stripping or plasma ashing.

Although the procedure to form the via trench 124 and the metal line trench 126 is provided above according to one or embodiments, other procedure may be alternatively applicable to form the via trench 124 and the metal line trench 126 using the patterned first and second photoresist layers. For example, after the second material layer 106 is patterned as illustrated in FIG. 13, a single etch process is implemented to form the via trench 124 and the metal line trench 126 in respective ILD material layers, as illustrated in FIG. 18. This can be achieved when various materials (including photoresist layers, the material layer 110, the second material layer 106 and the ILD material layers) are properly chosen in term of etch rate. In furtherance of this example, the etch stop layer 104C may be eliminated.

In another embodiment where the material layer 110 is not present, various etch operations applied to the material layer 110 are eliminated.

Figure 19:
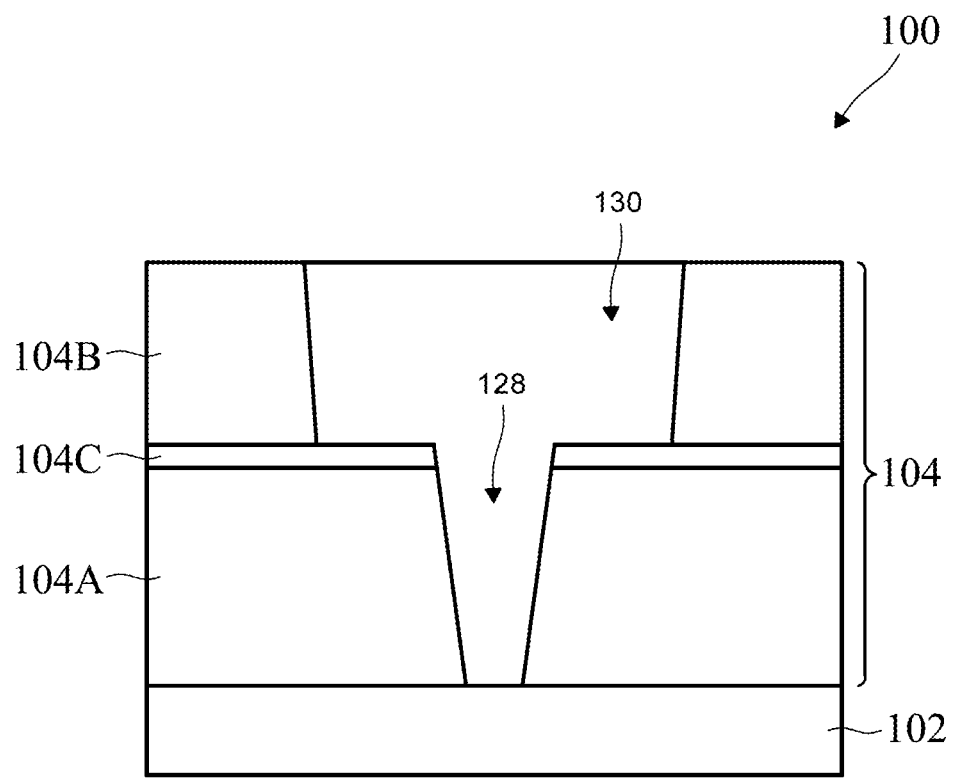

Referring to FIG. 19, via feature 128 and metal line 130 are formed by a suitable procedure. In one embodiment, a conductive material, such as metal or metal alloy, is filled in the via trench 124 and the metal line trench 126 (FIG. 18) by deposition, such as physical vapor deposition (PVD). A chemical mechanical polishing (CMP) process is applied to remove excessive conductive material and to planarize the top surface.

In another embodiment, the second material layer 106 may serve as a polishing stop layer and may be removed after the CMP process by an etch process. In a particular example, copper is used as the conductive material. In furtherance of this example, a copper seed layer is formed by PVD. Thereafter, bulk copper is filled in the trenches 124 and 126 by plating. A CMP process is subsequently applied to remove the excessive copper and planarize the top surface. In yet another embodiment, a lining material, such as titanium nitride, is formed on the sidewalls of the via trench 124 and the metal line trench 126 before filling in the trenches with the conductive material. The lining layer is deposited by a proper technique, such as PVD or CVD. The lining layer may function as a diffusion barrier and adhesive layer for integrity of the interconnect structure.

Although not shown, other processing operation may be presented to form various doped regions such as source and drain regions and/or devices features such as gate electrode. In one example, the substrate may alternatively include other material layer to be patterned by the disclosed method, such as another patterned metal layer. In another example, additional patterning steps may be applied to the substrate to form a gate stack. In another example, the source and drain features are of either an n-type dopant or a p-type dopant are formed by a conventional doping process such as ion implantation.

Figure 22:
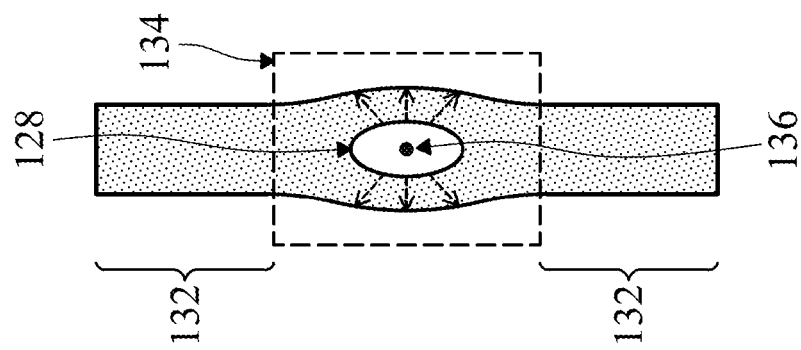
FIGS. 20 through 22 are top views of the semiconductor structure, in portion, of FIG. 19 constructed according to aspects of the present disclosure in one embodiment.
Figure 21:
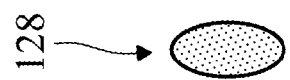
Figure 20:
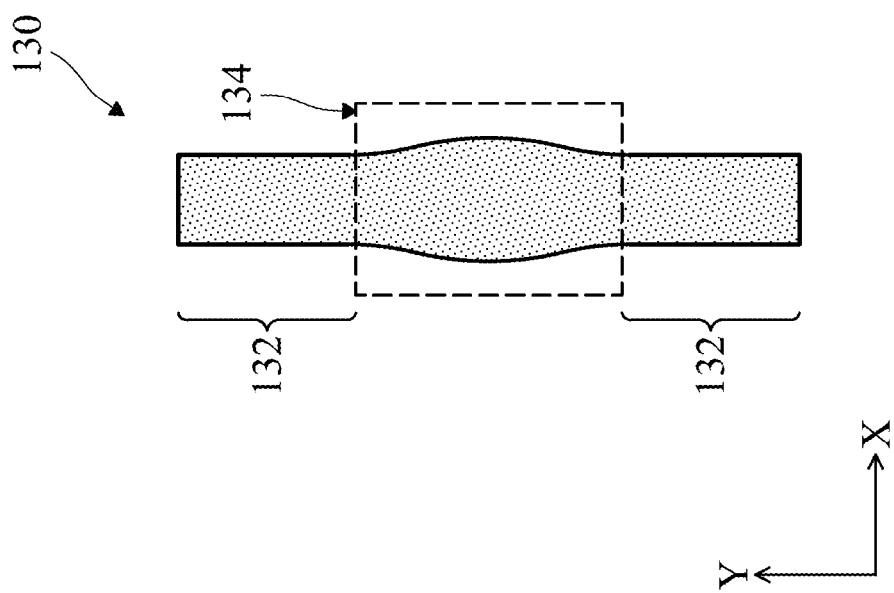

FIG. 20 is a top view of the metal line 130. FIG. 21 is a top view of the via feature 128. In one example, the via feature 128 has an oval shape in the top view. FIG. 22 is a top view of both the via feature 128 and metal line 130 together for better illustrating the spatial relationship there-between. In the top view, the metal line 130 is similar to the latent feature 34 of FIG. 4 and the via feature 128 is similar to the latent feature 42 in FIG. 6 since the corresponding metal line trench 126 and the via trench 124 are transferred from the latent features 34 and 42, respectively. In FIG. 20, the metal line 130 includes a relatively-straight portion 132 and a via-connection portion 134 as an image of the first feature 18 and the second feature 20 defined in the IC design pattern of FIG. 7. The via-connection portion 134 has a maximum dimension in the X direction greater than that of the straight portion 132.

The latent features 34 and 42 are intrinsically related because both are images of the same IC pattern defined on the photomask 50. Accordingly, the metal line 130 and the via feature 128 are intrinsically related to each other in terms of geometry (shape and size). That is, the via feature 128 and the via-connection portion 134 of the metal line 130 are spatially related as both are the images of the second feature 20.

The via feature 128 and the via-connection portion 134 of the metal line 130 are concentric with a common center 136 illustrated in FIG. 22. Furthermore, a sidewall profile of the via feature 128 and a sidewall profile of the via-connection portion 134 are similar in geometry, but with different sizes, which is further described below. The sidewall profile of the via feature 128 (or the via-connection portion 134 of the metal line 130) is its edge contour in the top view. The via feature 128 is less than the via-connection portion 134 of the metal line 130 in size. There are offsets between the edge (the sidewall) of the via feature 128 and the edge of the via-connection portion 134. Minimum edge distances between the edge of the via feature 128 and the edge of the via-connection portion 134 at various positions are illustrated in FIG. 22 by arrow lines. The minimum edge distances at different locations are same. Especially, various minimum edge distances on the left side and the right sides are same.

Various advantages may be present in various applications of the disclosed method. In one example, the via feature 128 and the metal line 130 are intrinsically and consistently aligned. If there is any overlay error during the lithography exposure process to expose both the first and second photoresist layers, the corresponding overlay errors also occur in the underlying features. The via feature 128 and the metal line 130 are collectively changed without relative shift (overlay error) between them. When the exposing light source has variation in intensity, the latent patterns on the first and second photoresist layers experience the same variation. Accordingly, the via feature 128 and the metal line 130 have the same spatial relationship, which includes common center, similarity in geometry and same minimum distances. State differently, the via feature 128 and the metal line 130 are spatially synchronized with various variations excluded.

Figure 23:
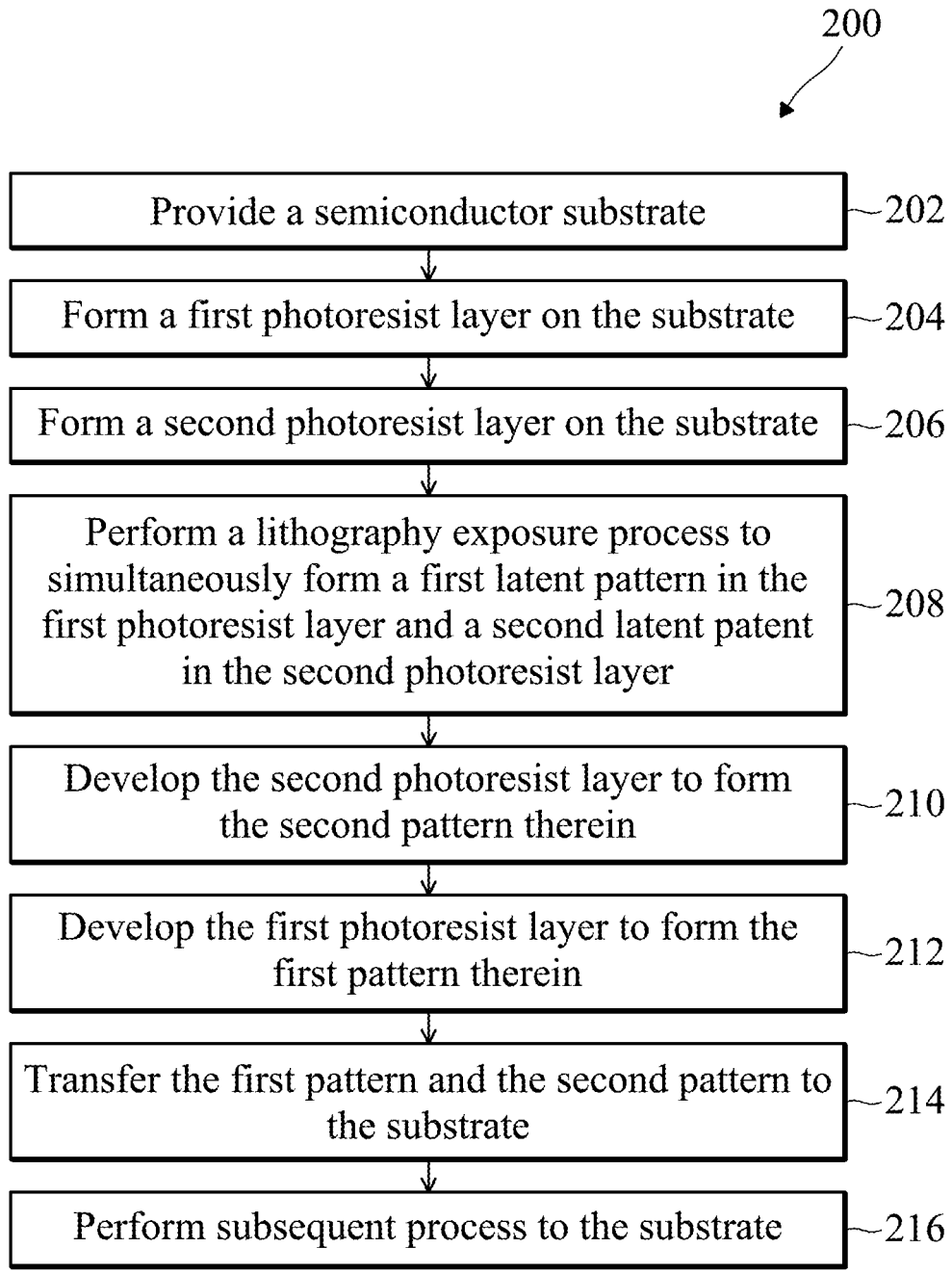
FIG. 23 is a flowchart of a method making a semiconductor structure constructed according to one or more embodiments of the present disclosure.

FIG. 23 is a flowchart of a method 200 of exposing two photoresist layers with respective latent patterns by single lithography exposure process, constructed according various aspects in one or more embodiments. The method 200 starts at 202 with a substrate, such as a semiconductor wafer. The substrate may further include one or more material layers, such as one or more patterned layers and one or more layers to be patterned.

At step 204, a first photoresist layer is formed on the substrate. Forming of the first photoresist layer includes coating the first photoresist layer on the substrate by a suitable technique, such as spin-on coating. Other manufacturing steps, such as baking, may further applied to the first photoresist layer.

At step 206, a second photoresist layer is formed on the first photoresist layer. Forming of the second photoresist layer includes coating the second photoresist layer on the substrate by a suitable technique, such as spin-on coating. Other manufacturing steps, such as baking, may further applied to the second photoresist layer.

The first and second photoresist layers may be the same or different in composition. In one embodiment, the second photoresist layer is different from the first photoresist layer in the exposure threshold. In another embodiment, the second photoresist layer is different from the first photoresist layer as they are developed with different developers and are exclusively indissoluble in the opposite developer. In another embodiment, a material layer is inserted between the first and second photoresist layer for separation, attenuation and/or etch mask.

The method 200 proceeds to step 208 and performs a lithography exposure process to simultaneously expose both the first and second photoresist layers, thereby forming a first latent pattern in the first photoresist layer and a second latent pattern in the second photoresist layer. The first and second patterns are different from each other and define respective patterns to be formed in different material layers. Various dimensions of the first and second latent patterns are tuned through exposure thresholds, attenuation to the exposing intensity and adjusting the corresponding IC design pattern according to different size biases. The exposing source may be UV, DUV, EUV, or charged particles, such as electron-beam. In one embodiment, the lithography exposure process uses a photomask with the IC design pattern defined thereon. In various example, the photomask may be transmissive (such as in UV and DUV) or reflective (such as in EUV). In another embodiment, the IC design pattern is defined in a data file and is transferred to the photoresist layers by direct writing or other suitable technique, such as digital pattern generator. Other steps may be implemented. In one embodiment, a post exposure baking process may be applied to the first and second photoresist layers after the lithography exposure process.

The method 200 proceeds to step 210 by developing the second photoresist layer to form the patterned second photoresist layer. The second photoresist layer with the second latent pattern is converted to the patterned second photoresist layer with various openings. In one embodiment, the second photoresist layer is positive tone, the portions of the second photoresist layer associated with the second latent pattern are removed by the corresponding developer, resulting in the openings in the second photoresist layer (the second photoresist layer with the second pattern converted from the second latent pattern).

The method 200 proceeds to step 212 by developing the first second photoresist layer to form the patterned first photoresist layer. The first photoresist layer with the first latent pattern is converted to the patterned first photoresist layer with various openings. In one embodiment, the first photoresist layer is positive tone, the portions of the first photoresist layer associated with the first latent pattern are removed by the corresponding developer, resulting in the openings in the first photoresist layer. Thereafter, other steps may be implemented. In one embodiment, one or more baking processes may be applied to the first and second photoresist layers collectively or separately.

The method 200 proceeds to step 214 by transferring the first pattern and the second pattern to the substrate or underlying material layers on the substrate. The operation 214 may include one or more etch processes, such as those various embodiments associated with FIGS. 8 through 19. In one embodiment, a via trench and a metal line trench are formed in respective ILD material layers. Other manufacturing operations may be implemented before, during or after the method 200. In one embodiment, a procedure including metal deposition and CMP is implemented thereafter to form a via feature (or contact feature) and a metal line overlapped and aligned.

Figure 24:
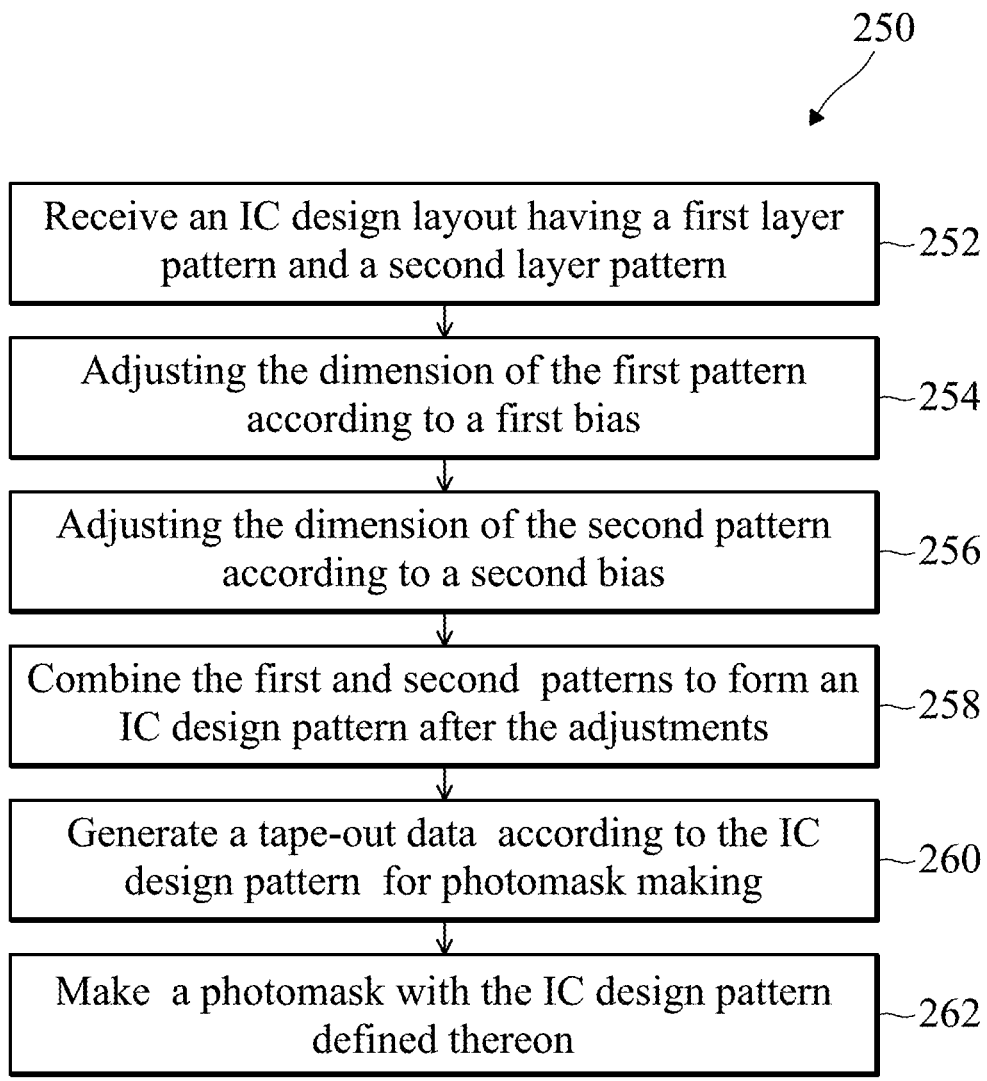
FIG. 24 is a flowchart of a method for designing an integrated circuit (IC) according to one or more embodiments of the present disclosure.

The present disclosure also provides a method for making a photomask, such as the photomask 50, that can be used in the method 200 of FIG. 23. FIG. 24 is a flowchart of a method 250 of generating the IC design pattern used for making the mask.

The method 250 begins at step 252 by receiving an IC design layout that includes a first layer pattern and a second layer pattern. The first layer pattern is designed to expose a first photoresist layer by a lithography exposure process and furthermore, to be formed in a first material layer on a substrate (such as a semiconductor wafer) and the second layer pattern is designed to expose a second photoresist layer by the lithography exposure process and furthermore, to be formed in a second material layer overlying the first material layer. In one embodiment for illustration, the first layer pattern includes a via pattern having a via feature (or a plurality of via features), and the second layer pattern is a metal line pattern having one metal line (or a plurality of metal lines).

The method 250 proceeds to step 254 by adjusting the dimensions of the first layer pattern according to a first bias (first size bias). The first bias is determined based on the first exposing intensity to the first photoresist layer and the first exposure threshold of the first photoresist layer such that the first photoresist layer is exposed to form a first latent pattern with proper dimensions, ending up with the via feature having proper dimensions.

The method 250 proceeds to step 256 by adjusting the dimensions of the second layer pattern according to a second bias (second size bias). The second bias is determined based on the second exposing intensity to the second photoresist layer and the second exposure threshold of the second photoresist layer such that the second photoresist layer is exposed to form a second latent pattern with proper dimensions, ending up with the metal line having proper dimensions. The first and second biases are different from each other since each is determined based on different criteria.

By different biases for the first layer pattern and the second layer pattern, the intensity difference between the first and second layer patterns is achieved. As an example illustrated in FIG. 5, the intensity peak 46 associated with the first layer pattern is different from (Specifically, greater than) the intensity peak 44 associated with the second layer pattern due to different biases. With this intensity difference, the first layer pattern can be selectively imaged to the first photoresist layer while the second layer pattern is not imaged to the first photoresist layer (such as by choosing different exposure thresholds and/or attenuation). The intensity difference may be achieved by various approaches, such as those illustrated in FIGS. 39 through 41.

The method 250 proceeds to step 258 by combining the first and second adjusted layer patterns to form a combined IC design pattern. The combined IC design pattern is a sum of the first and second adjusted layout patterns. For example, referring to FIG. 7, the first adjusted pattern includes the via feature 20 and the second adjusted pattern includes the metal line 18. The combined IC design pattern includes a feature 16 including both via feature 20 and the metal line 18. The first and second adjusted patterns are combined according to the spatial relationship when formed on the substrate (the spatial relationship between the via pattern and metal line pattern). In the present embodiment, the via feature and the metal line are aligned and overlapped when formed in the substrate in the top view. In this example as illustrated in FIG. 7, the via feature 20 has a dimension Vx and the metal line 18 has a dimension Lx less than Vx in the combined IC design pattern since the first bias and the second bias are different, even though the via feature 128 has a dimension in the X direction less than the corresponding dimension of the metal line 130 in the semiconductor substrate, as illustrated in FIG. 22.

The method 250 proceeds to step 260 by generating tape-out data according to the combined IC design pattern for photomasking (or alternatively for direct writing when the lithography exposure process uses charged particles, such as e-beam). The tape-out data includes the combined IC design pattern defined in a proper data format, such as in GDS format.

The method 250 proceeds to step 262 by making a photomask with the combined IC design pattern defined thereon. The making of the photomask is based on the tape-out data with the combined IC design pattern. In one example, the making of the photomask includes depositing an opaque material layer (such as chromium) on a photomask substrate and pattering the opaque material layer by an e-beam or other suitable technique. In another embodiment for EUV exposure process, the making of the photomask includes deposing ML reflective material layers, an absorber layer, and other material layers (such as capping layer and protection layer), and then patterning the opaque material layer by e-beam or other suitable technique. In another example where a phase shift mask is used, the making of the photomask includes deposition and/or patterning the deposited material layer.

Figure 25:
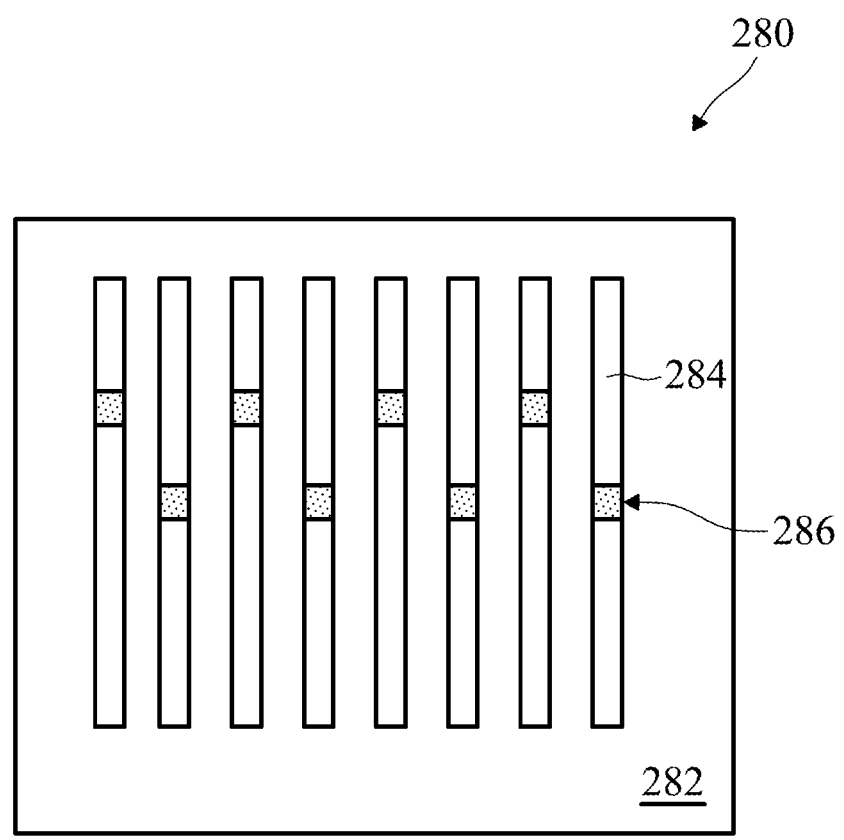
FIG. 25 is a top view of a semiconductor structure fabricated using the method of FIG. 23 constructed according to aspects of the present disclosure in one embodiment.

FIG. 25 illustrates a semiconductor structure 280 formed by the method 200. The semiconductor structure 280 includes a semiconductor substrate 282 and various IC devices, such as an array of random access memory (RAM) in a memory device. The semiconductor structure 280 also includes an interconnect structure to couple various IC deices to form a function circuit. The interconnect structure includes one or more metal layers and via features to connect the metal lines in the adjacent metal layers. As shown in FIG. 25, the interconnect structure includes a metal layer having a plurality of metal lines 284 and a via layer underlying the metal layer. The via layer includes a plurality of via features 286 aligned with and connected with the respective metal lines 284. The formation of the via features 286 and the metal lines 284 implements the method 200 of FIG. 23, such as the method described in FIGS. 8 through 19. The tape-out data or the photomask is formed by the method 280 of FIG. 24. Since the via features 286 are intrinsically aligned with the metal lines 280, the process window is increased and the design rules can be tighten to achieve a high packing density.

Figure 26:
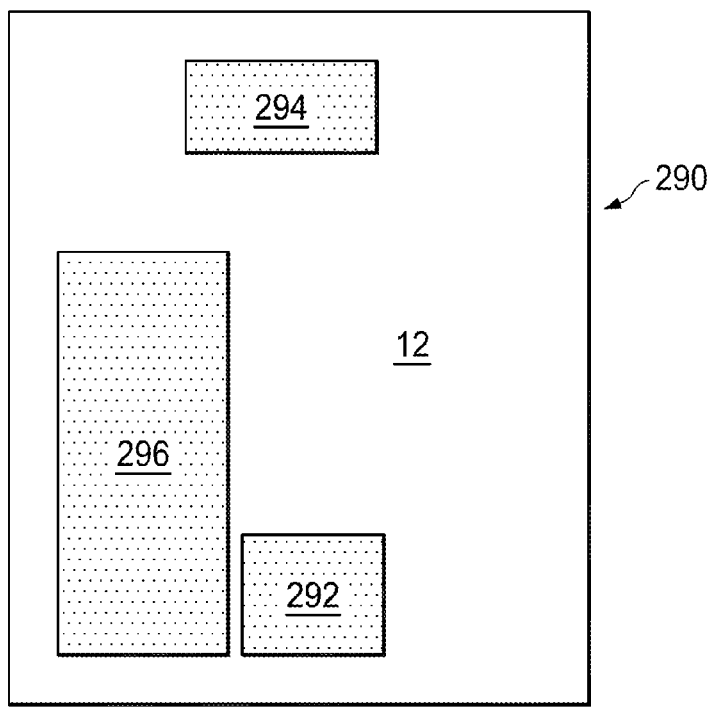
FIG. 26 is a top view of an example photomask constructed according to aspects of the present disclosure.

FIGS. 26 thorough 30 provide another embodiment of the application using the method of defining multiple layer patterns with single exposure (exposing two photoresist layers by one lithography exposure process). In this embodiment, a contact feature to a gate (also referred to as MP feature) and a contact feature to a doped region (also referred to as MD feature), such as a source or drain, are formed thereby. The descriptions of similar features are not repeated here for simplicity.

FIG. 26 is a top view of a photomask 290 having an IC design pattern constructed according to embodiments of the present disclosure. The photomask 290 includes a photomask substrate 12 and the IC design pattern formed thereon. The photomask 290 may be an UV mask, a DUV mask, an EUV mask or a PSM according various embodiments.

In the present embodiment, the IC design pattern includes MP features 292 and 294 and a MD feature 296. The MP features 292 and 294 are designed to form contacts to gates; and the MD feature 296 is designed to form a contact to a doped region.

Figure 27:
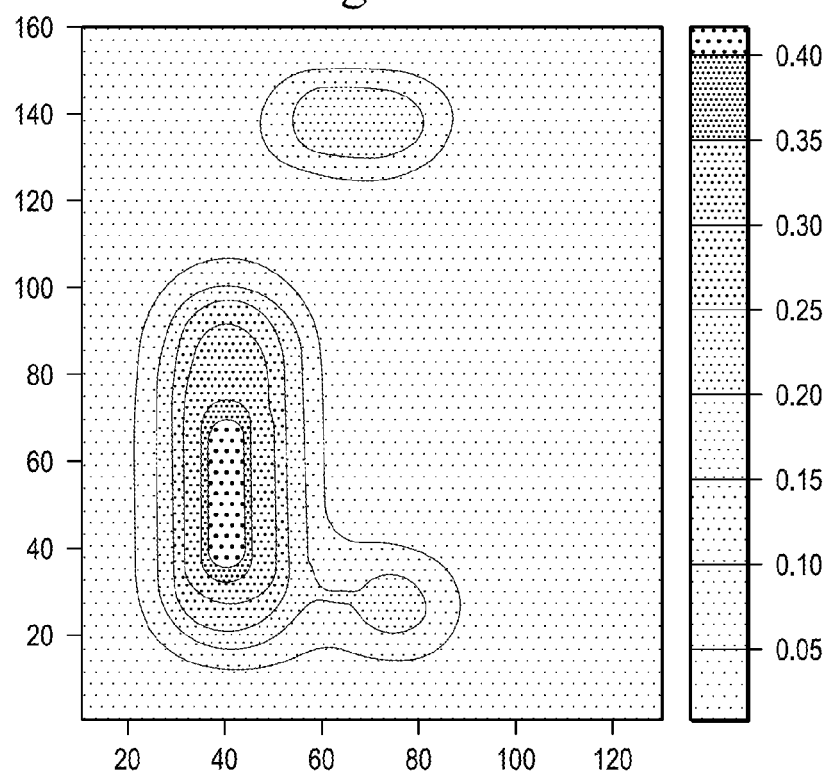
FIGS. 27 through 28 are diagrammatical views of various exposing intensity profiles during a lithography exposure process using the photomask of FIG. 26, according to one or more embodiments of the present disclosure.
Figure 28:
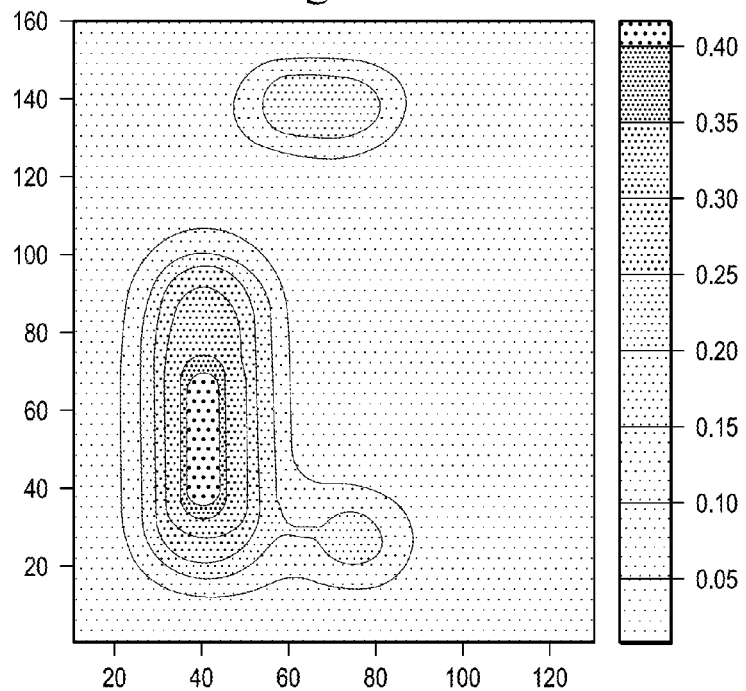
Figure 29:
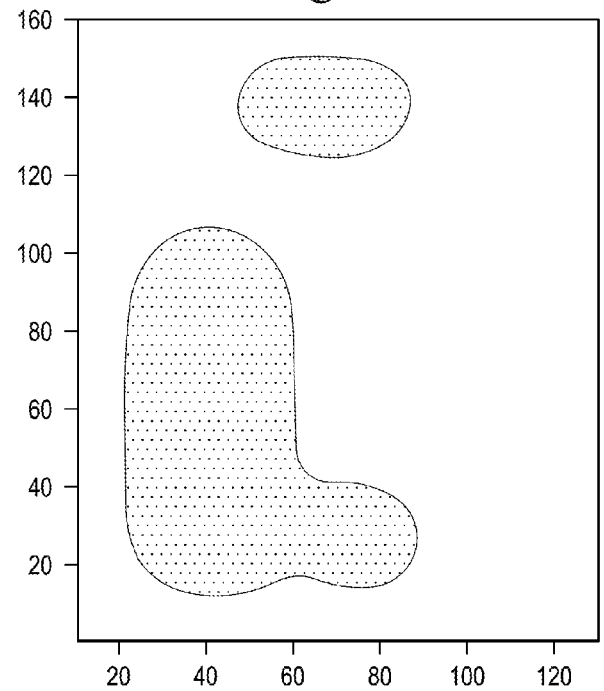
FIGS. 29 and 30 are top views of latent photoresist patterns in respective photoresist layers constructed using the photomask of FIG. 26 and according to one or more embodiments of the present disclosure.
Figure 30:
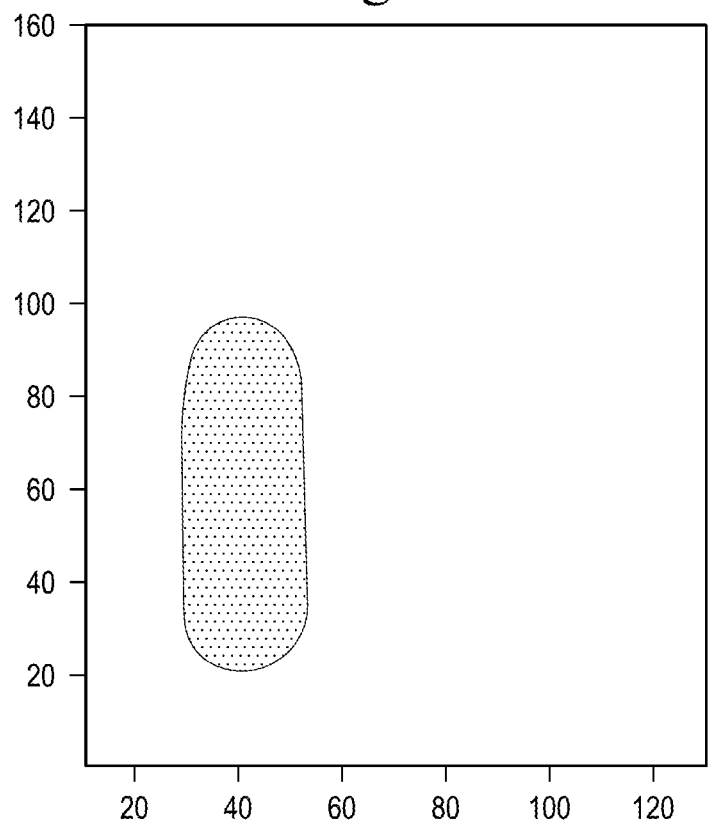

Two photoresist layers coated on a circuit substrate (such as a semiconductor wafer) are simultaneously exposed by a single lithography exposure process using the photomask 290. The first photoresist layer is underlying the second photoresist layer. The exposing intensity to the second photoresist layer is illustrated in FIG. 27 and the exposing intensity to the first photoresist layer is illustrated in FIG. 28. The format and various labels and intensity scales are similar to those in FIGS. 3 and 4. In the present embodiment, the first photoresist layer and the second photoresist layer are different from each other. The first photoresist layer has a first exposure threshold and the second photoresist layer has a second exposure threshold less than the first exposure threshold. Accordingly, by the lithography exposure process, a first latent pattern is formed in the first photoresist layer as illustrated in FIG. 30 and a second latent pattern is formed in the second photoresist layer as illustrated in FIG. 29. The first and second latent patterns are different from each other due to different exposure thresholds. Especially, when the exposure thresholds are properly chosen, the first latent pattern only includes the MD feature 296 and the second latent pattern includes the MD feature 296 and the MP features 292 and 294.

FIGS. 31 through 38 are sectional views of a semiconductor structure 300 at various fabrication stages. The semiconductor structure 300 includes MP and MD contacts to be formed by the method defining multiple layer patterns with single exposure. The semiconductor structure 300 and the method making the same are described below.

Figure 31:
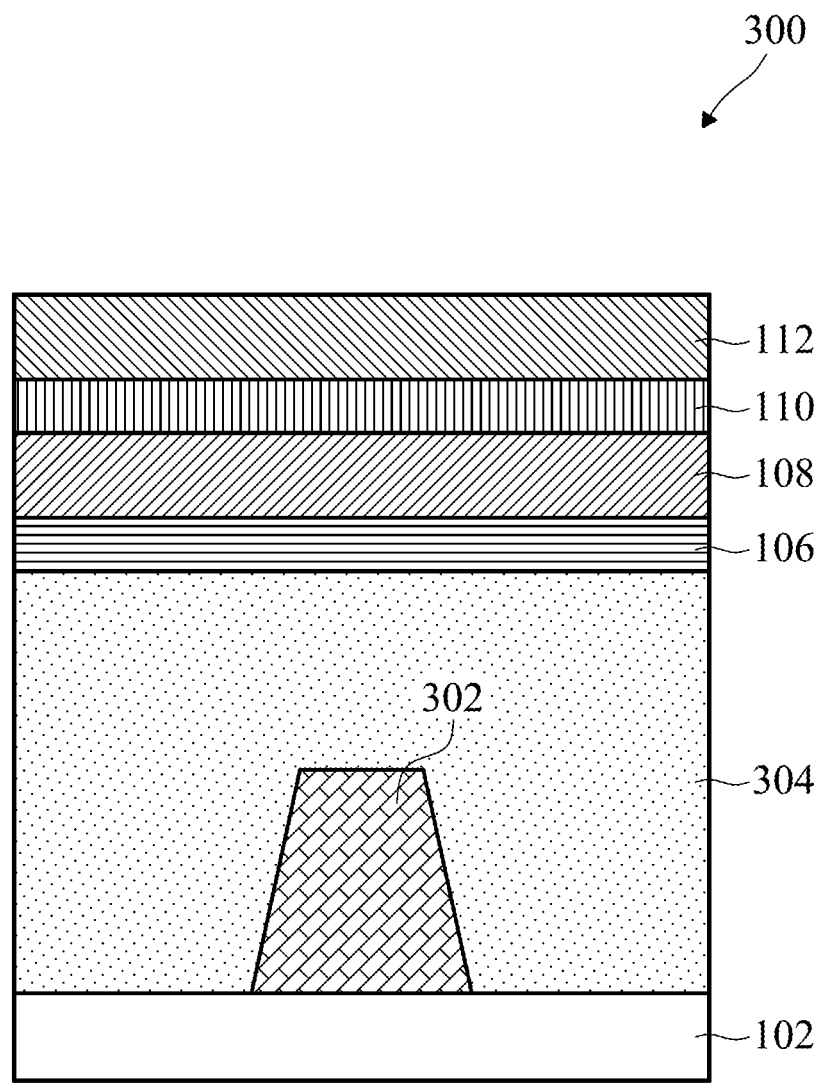
FIGS. 31 through 38 are sectional views of a semiconductor structure at various fabrication stages constructed according to one or more embodiments of the present disclosure, and using the photomask of FIG. 26.

Referring to FIG. 31, a semiconductor substrate 102 is provided. In the present embodiment, a gate (including gate dielectric and gate electrode) 302 is formed on the substrate 102. The formation of the gate 302 includes deposition and patterning. Other features, such as source and drain, are formed on the substrate 102 by a suitable technique, such as ion implantation. In the present embodiment, the source and drain are formed on sides of the gate 302.

Various material layers are formed on the substrate 102 and the gate 302. A dielectric material layer 304 is formed on the substrate 102. In the present embodiment, the dielectric material layer 304 includes an ILD material layer, such as silicon oxide, low k dielectric material, other suitable dielectric material or combination thereof. In another embodiment, the dielectric material layer 304 may include one or more dielectric films.

Two photoresist layers are subsequently formed on the dielectric material layer 304. Specifically, a first photoresist layer 108 is formed over the dielectric material layer 304. A second photoresist layer 112 is formed over the first photoresist layer 108. Other steps, such as baking, may follow the coating of each photoresist layer.

In one embodiment, the second photoresist layer 112 is different from the first photoresist layer 108. The first and second photoresist layers are chosen to have different exposure thresholds. Particularly, the exposure threshold of the first photoresist layer is greater than the exposure threshold of the second photoresist layer.

In another embodiment, a material layer 110 is formed between the first and second photoresist layers. The material layer 110 is inserted there-between to serve one or more functions. In one example, the material layer 110 separates the first and second photoresist layers from each other if those two photoresist layers are mutually dissoluble to a same developer. In another example, the material layer 110 functions to absorb the exposing beam such that the exposing beam projected on the second photoresist layer 112 is partially absorbed and only a portion of the exposing beam reaches the first photoresist layer 108. Thus the exposing intensity to the first photoresist layer 108 is less than the exposing intensity to the second photoresist layer 112. In another example, the material layer 110 functions as a hard mask during subsequent operations to pattern the dielectric material layer 304. In one embodiment, the material layer 110 includes a dielectric material, such as aluminum oxide, silicon oxide, silicon nitride, titanium oxide, or other suitable material. The material layer 110 is formed by spin-on coating or low temperature deposition without damage to the underlying photoresist layer 108.

In another embodiment, a second material layer 106 is formed between the dielectric material layer 304 and the first photoresist layer 108. In the present embodiment, the second material layer 106 functions as a hard mask during the subsequent operations to pattern the dielectric material layer 304.

Figure 32:
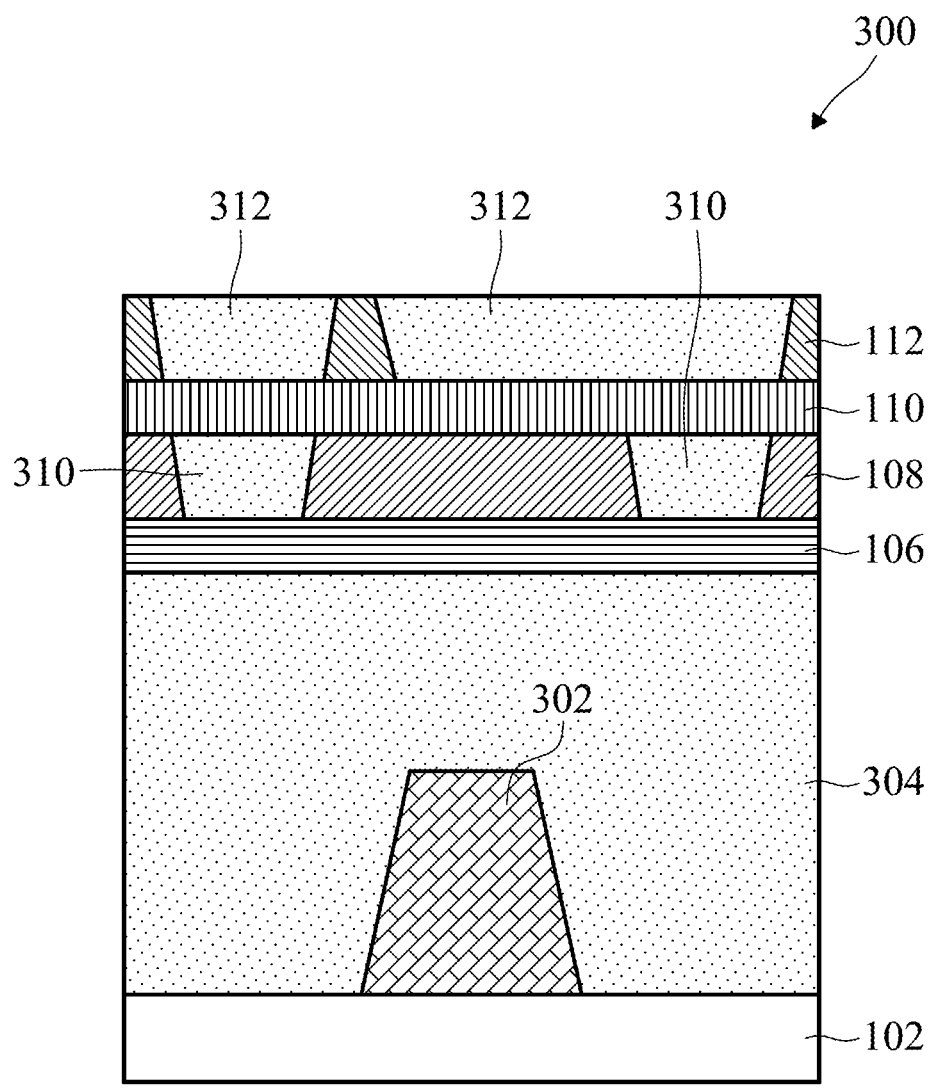

Referring to FIG. 32, a lithography exposure process is implemented using a photomask (such as the photomask 290) to simultaneously expose both the first and second photoresist layers, thereby forming latent patterns on respective photoresist layers. During the lithography exposure process, the IC design pattern defined in photomask is imaged to the second photoresist layer 112 and the first photoresist layer 108. A first latent pattern 310 is formed in the first photoresist layer 108 and a second latent pattern 312 is formed in the second photoresist layer 112. The first and second latent patterns are different from each other due to different biases, different exposing intensities, and/or different exposure thresholds.

Figure 33:
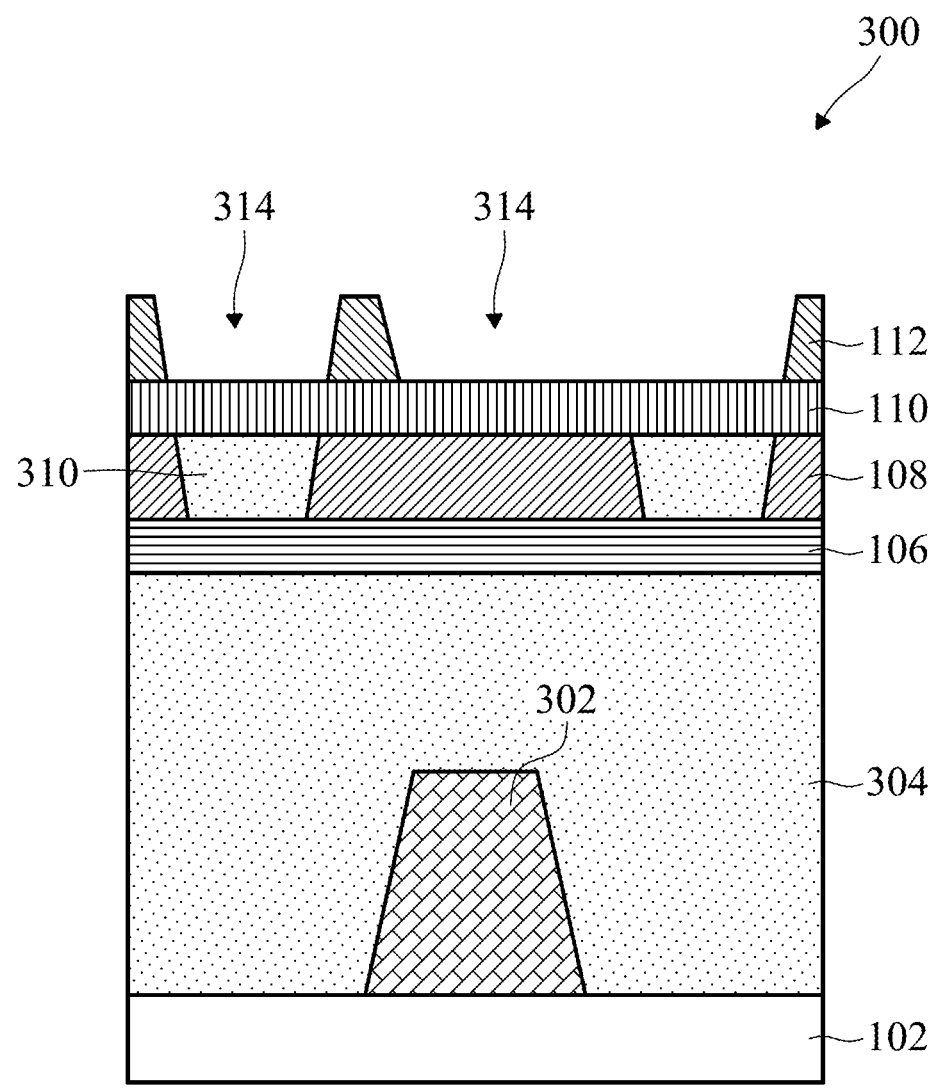

Referring to FIG. 33, the second photoresist layer 112 is developed by a first developer in a first developing process. In the present embodiment, both the first and second photoresist layers are positive tone. The exposed portion (the second latent pattern 312) is removed in the developer, thereby forming a patterned second photoresist layer having openings 314 associated with the second latent pattern 312. Other operations, such as hard baking, may follow the developing process.

Figure 34:
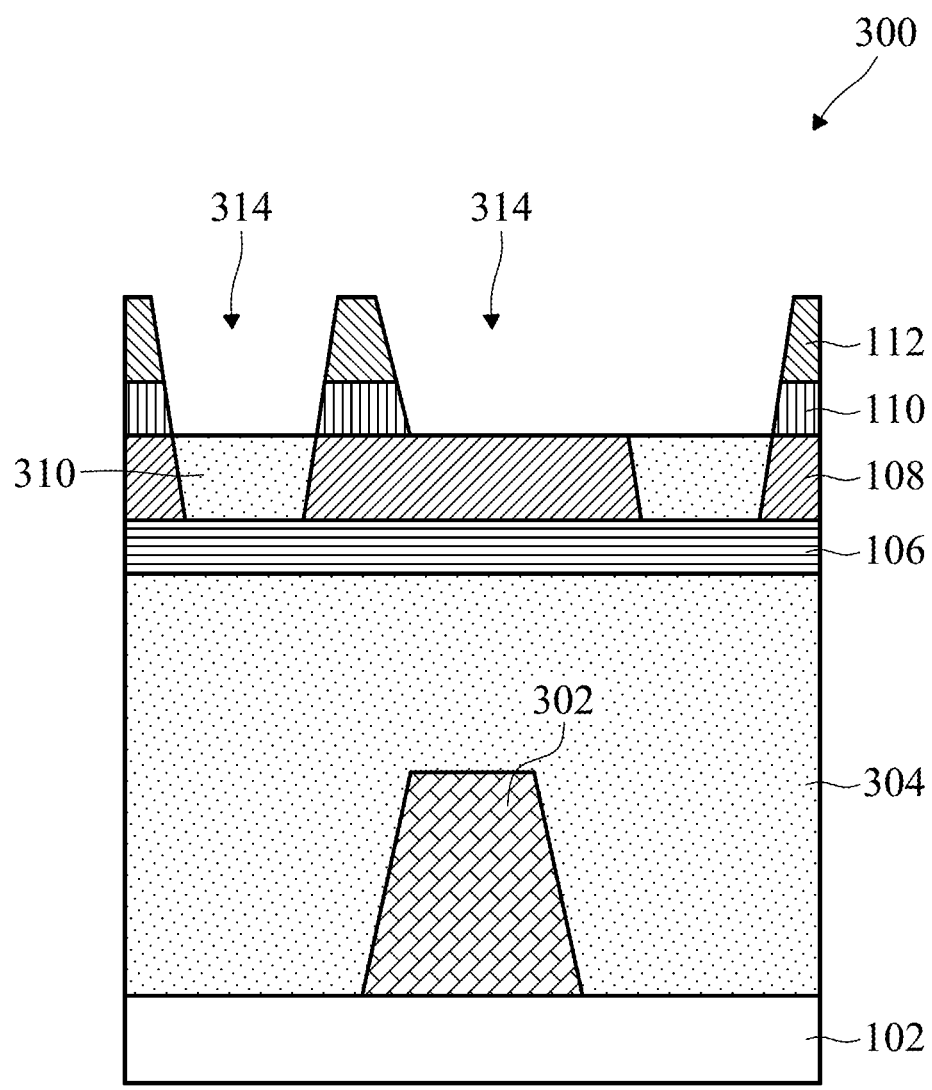

Referring to FIG. 34, an etch process is applied to selectively etch the material layer 110 and removes the portion of the material layer 110 within the opening 314 uncovered by the patterned second photoresist layer 112. The etch process and the etchant are properly chosen for selective etch without damage to the photoresist.

Figure 35:
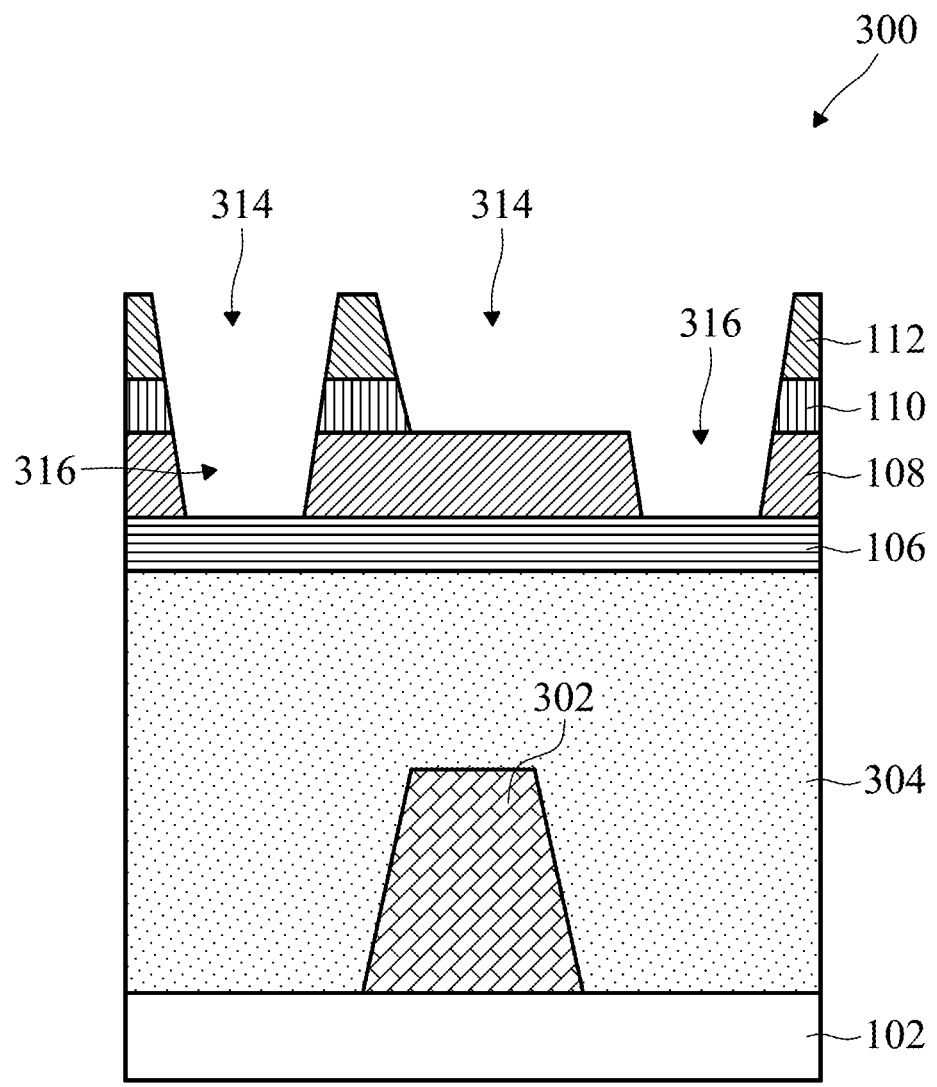

Referring to FIG. 35, the first photoresist layer 108 is developed by a second developer in a second developing process. In the present embodiment, the first photoresist layer is positive tone. The exposed portion (the first latent pattern 310) is removed in the second developer, thereby forming a patterned first photoresist layer having openings 316 associated with the first latent pattern 310. Other operations, such as hard baking, may follow the developing process. The first and second developers may be same or alternatively different in various embodiments, as described above.

Figure 36:
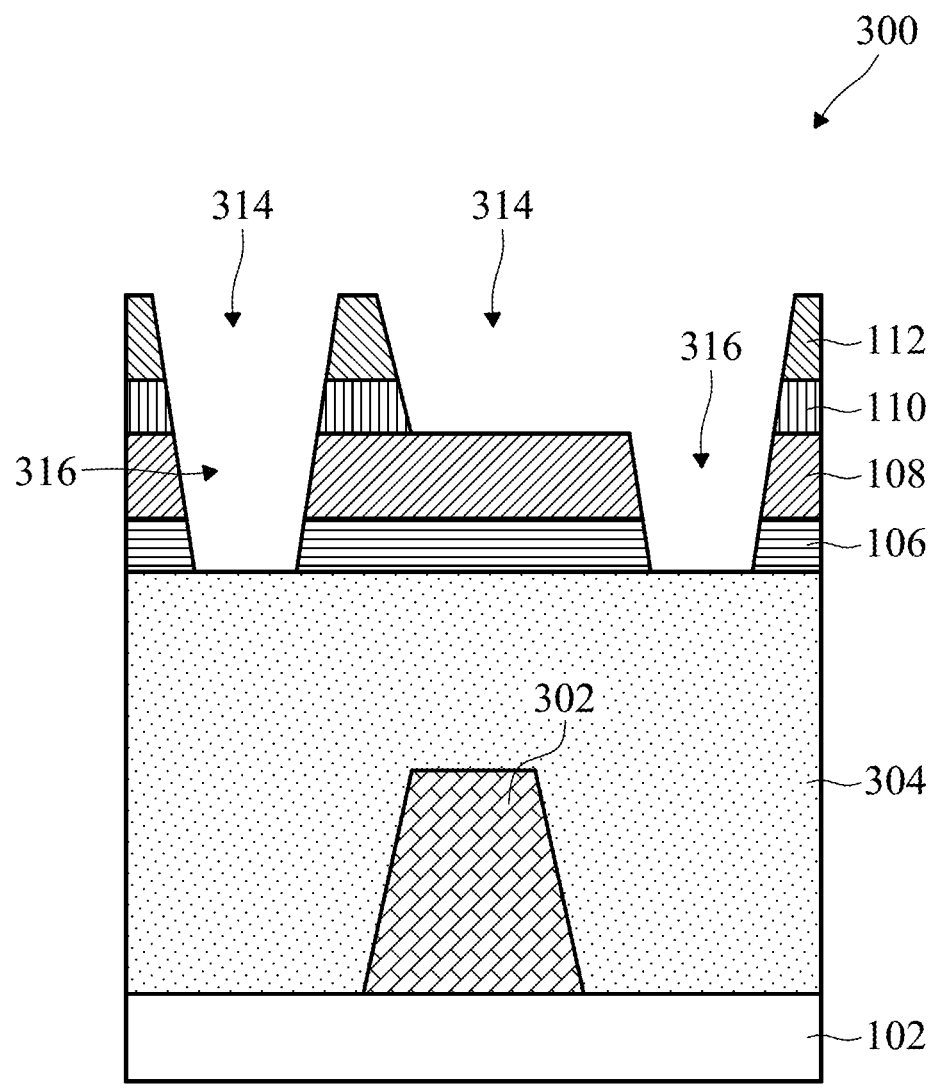

Referring to FIG. 36, another etch process is applied to selectively etch the second material layer 106 and removes the portion of the second material layer 106 within the openings 316 uncovered by the patterned first photoresist layer 108.

Figure 37:
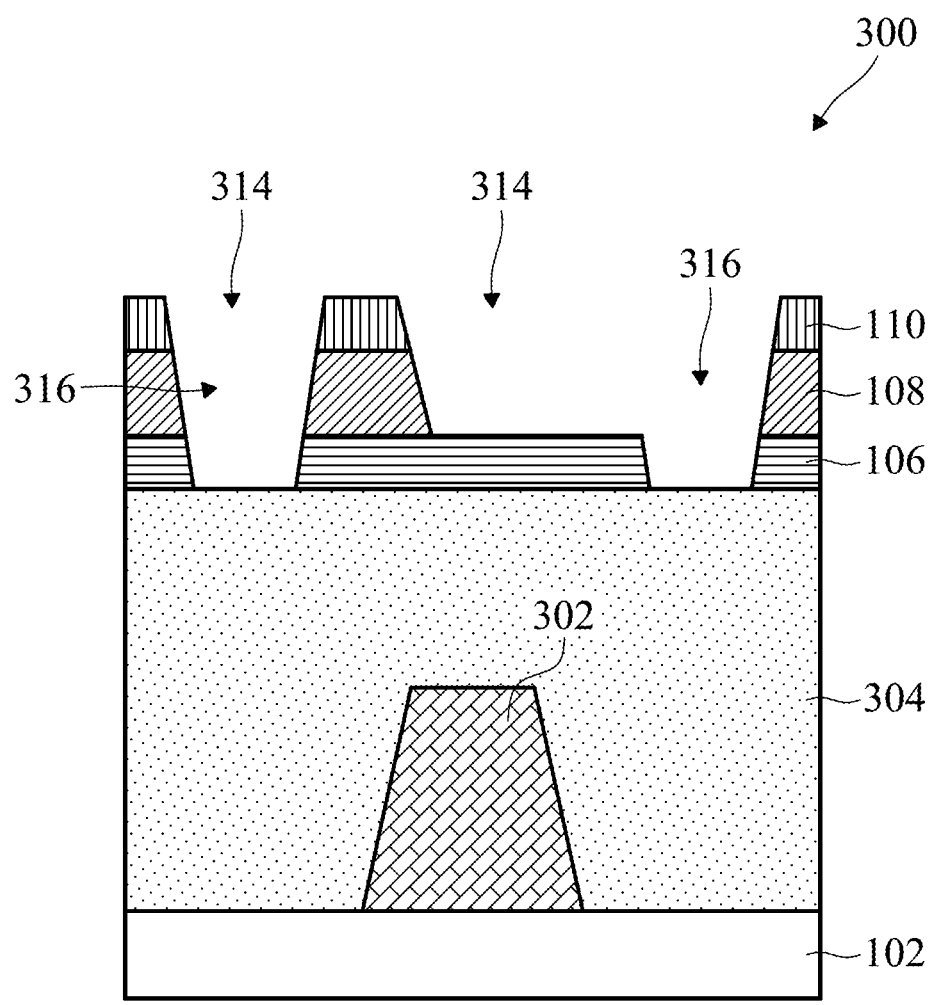

Referring to FIG. 37, a trimming process is applied to trim the photoresist layers, thereby removing the second photoresist layer 112 and the uncovered portions of the first photoresist layer 108. In one embodiment, the trimming process is similar to a process to strip the photoresist. For example, the trimming process implements wet stripping.

Figure 38:
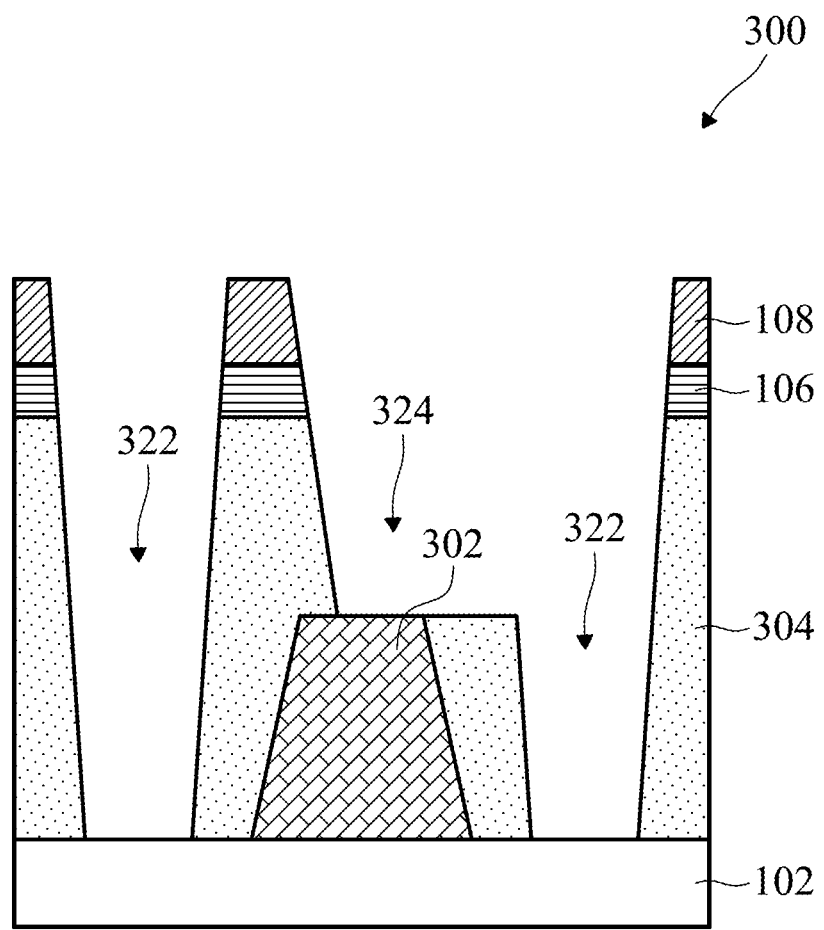

Referring to FIG. 38, an etch process is applied to etch the dielectric material layer 304, forming MD contact trenches 322 landing on the doped features (such as source and drain) and MP contact trench 324 landing on the gate 302.

Other operations may be subsequently implemented. In one embodiment, the first photoresist layer 108 may be removed by wet stripping or plasma ashing. In another embodiment, MD and MP contact features are formed by a proper procedure. In one embodiment, a conductive material, such as metal or metal alloy, is filled in the MD and MP trenches by deposition. A CMP process is applied to remove excessive conductive material and to planarize the top surface. The second material layer 106 may serve as a polishing stop layer and may be removed after the CMP process by an etch process. In a particular example, tungsten is used as the conductive material. In another embodiment, a lining material, such as titanium nitride, is formed on the sidewalls of the trenches before filling in the trench with the conductive material. The lining layer is deposited by a proper technique, such as PVD or CVD. The lining layer may function as a diffusion barrier and adhesive layer.

Figure 39:
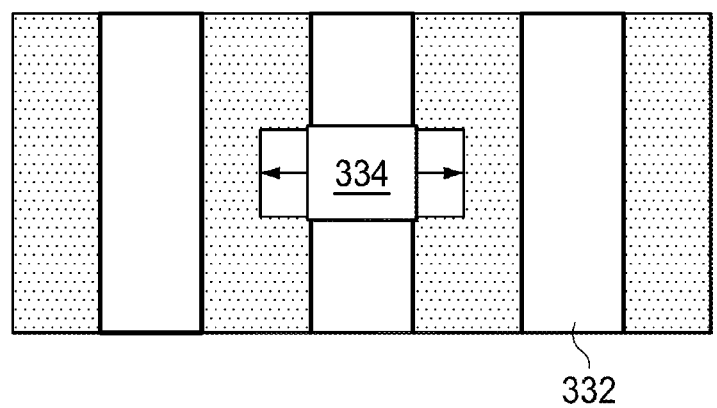
FIGS. 39 and 41 are top views of IC design patterns constructed according to aspects of the present disclosure in various embodiments.
Figure 40:
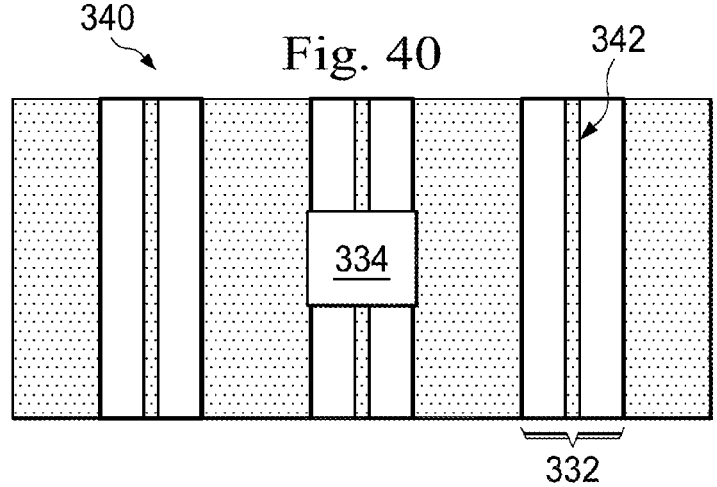
Figure 41:
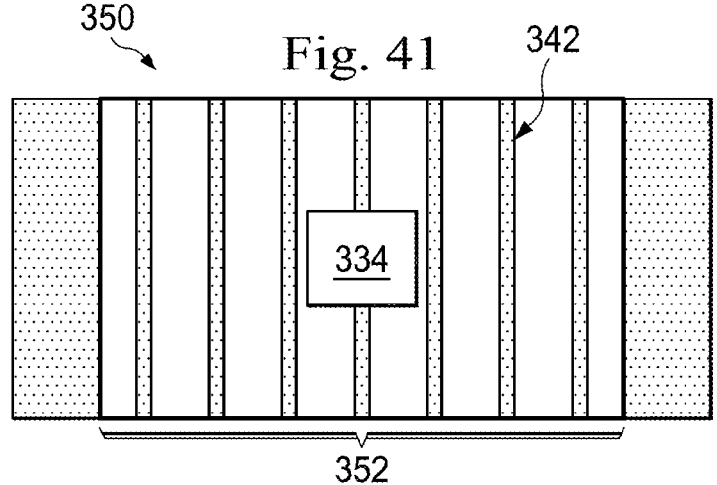

Provided below are various structures of an IC design pattern used to form multiple layer patterns with single exposure. As an example for illustration and easy understanding, the combined IC design pattern is used to form a via layer pattern and a metal layer pattern. The via layer pattern includes one or more via features and the metal layer pattern includes one or more metal lines. In the current embodiment, the IC design pattern is defined on a photomask (alternative it may be defined in a data file for direct e-beam writing). FIGS. 39 through 41 are top views of a photomask with an IC design pattern, constructed according to various embodiments.

As illustrated and discussed in FIGS. 1 through 6, in the IC design pattern 10, the metal lines (14 and 18) are not printed on the via layer (the first photoresist layer 40) but only the via feature 20 is printed in the via layer because of the exposing intensity difference. As shown in FIG. 2, the exposing intensity peak 44 is associated with the metal line 14 and the exposing intensity peak 46 is associated with the via feature 20. The exposing intensity peak 46 for the via feature 20 is greater than the exposing intensity peak 44 for the metal line 14. Various structures of IC design pattern in FIGS. 39 through 41 provide different approaches to enhances the intensity difference by increasing the exposing intensity to the via layer pattern and/or suppressing the exposing intensity to the metal layer pattern. Those approaches may be used in the method 250 of FIG. 24 for photomask making.

Referring to FIG. 39, photomask 330 includes various metal lines 332 and a via feature 334. In the present embodiment, the photomask 330 is a binary mask coated with an opaque material (such as Cr) that is further patterned to have various openings for metal lines and via features. As the different bias is used to adjust the dimension of the via feature 334, the via feature 334 is enlarged in size (the dimension in the X direction is enlarged), causing the increased exposing intensity to the via feature 334.

Referring to FIG. 40, photomask 340 includes various metal lines 332 and a via feature 334. To suppress the exposing intensity to the metal lines, sub-resolution features 342 are inserted in the metal lines to reduce the exposing intensity of the metal lines 332. The sub-resolution features are assist features with a dimension less than the minimum resolution size of the lithography exposing system, therefore are not printed on the photoresist layer but will impact the exposing intensity.

Referring to FIG. 41, photomask 350 includes a wide metal line 352 and a via feature 334. To suppress the exposing intensity to the metal line 352, one or more sub-resolution features 342 are inserted in the wide metal line 352 to reduce the exposing intensity of the metal line 352. The sub-resolution features 342 may be parallel with the metal line 352 (as shown in FIG. 41) or alternatively orthogonal with the metal line 352. This configuration effectively enhances the intensity difference and prevents the metal line from printing in the via layer.

Figure 42:
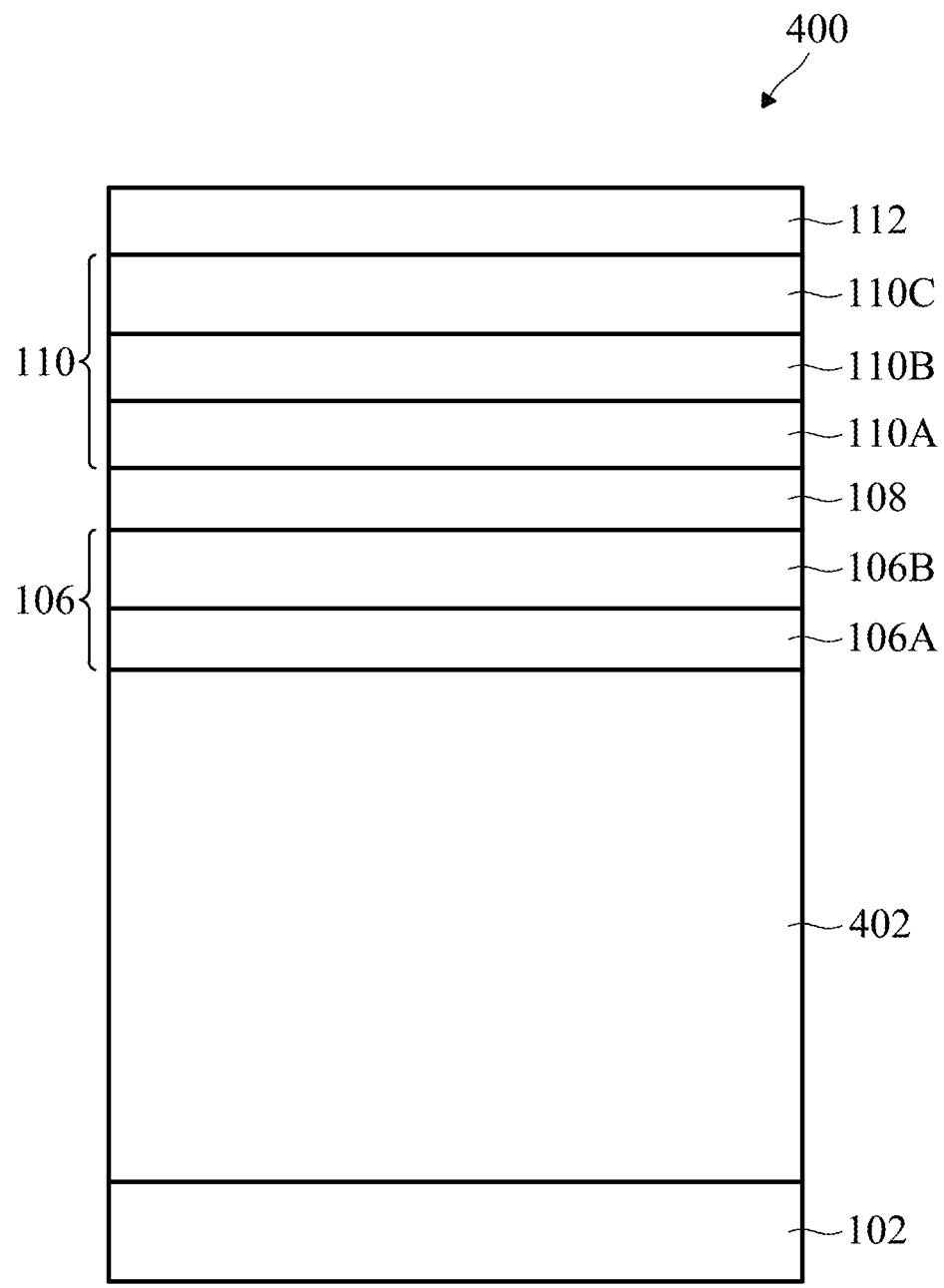
FIG. 42 is a sectional view of a semiconductor structure constructed according to aspects of the present disclosure in one embodiment.

FIG. 42 is a sectional view of the semiconductor structure 400 used in the method 200, such as the method in FIGS. 8 through 19 or the method in FIGS. 31 through 38, constructed according one embodiment. For example, the semiconductor structure 400 is alternatively used for the semiconductor structure 100 of FIG. 8 or the semiconductor structure 300 of FIG. 31. In this embodiment, the material layer 110 or the second material layer 106 includes more than one films.

The semiconductor structure 400 includes a substrate 102 and a dielectric material layer 402. In one example, the dielectric material layer 402 is similar to the dielectric material layer 104 of FIG. 8. In another example, the dielectric material layer 402 is similar to the dielectric material layer 304 of FIG. 31.

The semiconductor structure 400 includes a second material layer 106 on the dielectric material layer 402, a first photoresist layer 108 on the second material layer 106, a material layer 110 on the first photoresist layer 108 and a second photoresist layer 112 on the material layer 110. In one example, the first photoresist layer 108 or the second photoresist layer 112 has a thickness ranging between about 20 nm and about 80 nm.

The second material layer 106 includes a bottom layer 106A with a suitable material for anti-reflection and may have a thickness ranging between about 20 nm and about 100 nm. The second material layer 106 includes a middle layer 106B of a suitable material with a proper etch selective ratio and may have a thickness ranging between about 10 nm and about 40 nm.

In the present embodiment, the material layer 110 includes a hard mask layer 110A with a suitable material for photon-attenuation and may have a thickness ranging between about 10 nm and about 40 nm. The second material layer 106 includes a bottom layer 110B with a suitable material for anti-reflection and may have a thickness ranging between about 10 nm and about 40 nm. The material layer 110 includes a middle layer 110C of a suitable material with a proper etch selectivity and may have a thickness ranging between about 10 nm and about 40 nm.

The present disclosure is not limited to applications in which the semiconductor structure includes particular devices, such as SRAM devices, and may be extended to other integrated circuit. For example, the semiconductor structure may include a metal oxide semiconductor filed effect transistor (MOSFET), dynamic random access memory (DRAM) cell, a single electron transistor (SET), an imaging sensor, and/or other microelectronic devices (collectively referred to herein as microelectronic devices).

Although embodiments of the present disclosure have been described in detail, those skilled in the art should understand that they may make various changes, substitutions and alterations herein without departing from the spirit and scope of the present disclosure. For example, the IC design pattern to define multiple layer patterns is formed in a photomask. Alternatively, the IC design pattern is recorded in a data file used in e-beam direct writing. In another example, more than two photoresist layers (such as three photoresist layers) are simultaneously exposed by a single lithography exposure process through adjusting the feature size, adding assist feature (such as sub-resolution feature), attenuating of the light intensity (by an attenuating material or attenuation of the photoresist), and/or tuning the exposure thresholds.

Thus, the present disclosure provides a method for making a semiconductor device. The method includes forming a first photoresist layer on a substrate; forming a second photoresist layer over the first photoresist layer; and performing a lithography exposure process to the first photoresist layer and the second photoresist layer, thereby forming a first latent feature in the first photoresist layer and a second latent feature in the second photoresist layer.

The present disclosure also provides one embodiment of a photomask. The photomask includes a substrate; and a pattern formed on the substrate and having a first feature and a second feature. The first feature is designed to form a first main feature in a first material layer on a semiconductor substrate, and the second feature is designed to form a second main feature in a second material layer disposed on the first material layer.

The present disclosure provides one embodiment of a method for photomask making. The method includes receiving an integrated circuit (IC) design layout having a first pattern layer and a second pattern layer. The first pattern layer defines at least a first feature to be formed in a first material layer on a substrate and the second pattern layer defines at least a second feature to be formed in a second material layer disposed on the first material layer. The method further includes adjusting at least one of the first feature and the second feature; thereafter, combining the first feature and the second feature according to an alignment between the first and second main features, thereby forming a combined feature, and generating a tape-out data defining a combined pattern to be formed on a photomask, wherein the combined pattern includes the combined feature.

The present disclosure also provides one embodiment of a semiconductor structure. The semiconductor structure includes a substrate; a via feature formed on the substrate; and a metal line formed on the via feature. The metal line includes a first segment and a second segment portion intersected with the first segment. The second segment of the metal line is co-centered with the via feature in a top view. The via feature has a first sidewall profile, and the second segment of the metal line has a second sidewall profile similar to the first sidewall profile.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    forming a first photoresist layer a substrate;
    forming a second photoresist layer over the first photoresist layer; and
    performing a lithography exposure process to the first photoresist layer and the second photoresist layer, thereby forming a first latent feature in the first photoresist layer and a second latent feature in the second photoresist layer,
    wherein the second latent feature is overlapped with the first latent feature in a top view toward the substrate.

2. The method of claim 1, further comprising:
    developing the first photoresist layer to form a first main feature from the first latent feature; and
    developing the second photoresist layer to form a second main feature from the second latent feature.

3. The method of claim 2, further comprising, before forming the first photoresist layer:
    forming a first material layer over the substrate; and
    forming a second material layer over the first material layer.

4. The method of claim 3, further comprising, after the developing the first photoresist layer and the developing the second photoresist layer:
- transferring the first main feature to the first material layer; and
- transferring the second main feature to the second material layer.

5. The method of claim 1, further comprising forming a material layer between the first and second photoresist layers, wherein the material layer is insensitive to exposure energy used in the lithography exposure process.

6. The method of claim 5, wherein the material layer attenuates the exposure energy.

7. The method of claim 5, wherein the material layer includes a dielectric material deposited by low temperature and selected from the group consisting of silicon oxide, silicon nitride and titanium nitride.

8. The method of claim 5, wherein the material layer includes aluminum oxide (Al2O3) formed by spin coating.

9. The method of claim 1, further comprising forming a third photoresist layer over the second photoresist layer, wherein the performing the lithography exposure process includes performing the lithography process simultaneously to the first, second and the third photoresist layers, thereby forming the first latent feature in the first photoresist layer, the second latent feature in the second photoresist layer, and a third latent feature in the third photoresist layer.

10. The method of claim 1, wherein
the performing the lithography exposure process includes performing the lithography exposure process using a photomask with a pattern having a first main feature and a second main feature intersected;
the first main feature is designed to form the first latent feature in the first photoresist layer, and the second main feature is designed to form the second latent feature in the second photoresist layer;
the first main feature spans a first dimension in a first direction and a second dimension in a second direction perpendicular to the first direction;
the second main feature spans a third dimension in the first direction and a fourth dimension in the second direction; and
the first dimension is greater than the third dimension and the second dimension is less than the fourth dimension.

11. A method, comprising:
forming a first photoresist layer over a substrate;
forming a second photoresist layer over the first photoresist layer; and
performing a lithography exposure process to the first photoresist layer and the second photoresist layer, thereby forming a first latent feature in the first photoresist layer and a second latent feature in the second photoresist layer, wherein
the first photoresist layer has a first exposure threshold; and
the second photoresist layer has a second exposure threshold different than the first exposure threshold.

12. A method, comprising:
forming a first photoresist layer over a substrate;
forming a second photoresist layer over the first photoresist layer; and
performing a lithography exposure process to the first photoresist layer and the second photoresist layer, thereby forming a first latent feature in the first photoresist layer and a second latent feature in the second photoresist layer,
wherein the first photoresist layer is dissoluble in a first developer and is indissoluble in a second developer; and the second photoresist layer is dissoluble in the second developer and is indissoluble in the first developer.

13. A method, comprising:
forming a dielectric material layer over a substrate;
forming a first photoresist layer over the dielectric material layer;
forming an intermediate material layer over the first photoresist layer;
forming a second photoresist layer over the intermediate material layer;
performing a lithography exposure process to the first photoresist layer and the second photoresist layer using a photomask, thereby simultaneously forming a first latent feature in the first photoresist layer and a second latent feature in the second photoresist layer;
developing the second photoresist layer to form a first main feature from the second latent feature;
developing the first photoresist layer to form a second main feature from the first latent feature; and
transferring the first and second main features to the dielectric material layer by at least one etch process, wherein
the dielectric material layer includes a first interlayer dielectric (ILD) material layer and a second ILD material layer over the first ILD material layer; and
the transferring the first and second main features includes transferring the second main feature in the first photoresist layer to the first ILD material layer and transferring the first main feature in the second photoresist layer to the second ILD material layer.

14. The method of claim 13, wherein
the first photoresist layer has a first exposure threshold; and
the second photoresist layer has a second exposure threshold less than the first exposure threshold.

15. The method of claim 13, wherein the intermediate material layer attenuates an exposure light.

16. The method of claim 15, wherein the intermediate material layer includes a dielectric material deposited by low temperature and selected from the group consisting of silicon oxide, silicon nitride and titanium nitride.

17. The method of claim 15, wherein the intermediate material layer includes aluminum oxide (Al2O3) formed by spin coating.

18. A method, comprising:
forming a first photoresist layer over a substrate;
forming a second photoresist layer over the first photoresist layer; and
performing a lithography exposure process to the first photoresist layer and the second photoresist layer using a photomask with a pattern having a first main feature and a second main feature contacting each other, thereby forming a first latent feature in the first photoresist layer and a second latent feature in the second photoresist layer.

19. The method of claim 18, wherein the second latent feature is overlapped with the first latent feature in a top view toward the substrate.

20. The method of claim 18, further comprising:
developing the first photoresist layer to form a first patterned photoresist layer defining a first feature;
developing the second photoresist layer to form a second patterned photoresist layer defining a second feature;
after the developing of the first photoresist layer and the developing of the second photoresist layer, transferring the first main feature to a first material layer over the substrate; and
transferring the second main feature to a second material layer over the first material layer.

21. The method of claim 18, wherein the first photoresist layer and the second photoresist layer are positive-tone.

22. The method of claim 18, wherein the first main feature is defined on the photomask with a first bias and the second main feature is defined on the photomask with a second bias different from the first bias.

23. A method, comprising:
forming a first photoresist layer over a substrate;
forming a second photoresist layer over the first photoresist layer, wherein the first and second photoresist layers have a same type of sensitivity; and
performing a lithography exposure process to the first photoresist layer and the second photoresist layer, thereby forming a first latent feature in the first photoresist layer and a second latent feature in the second photoresist layer.

24. The method of claim 23, wherein the first and second photoresist layers are positive-tone.

25. A method, comprising:
forming first and second photoresist layers over a substrate;
performing a lithography exposure process to the first photoresist layer and the second photoresist layer, thereby forming a first latent feature in the first photoresist layer and a second latent feature in the second photoresist layer,
wherein the first photoresist layer is dissoluble in a first developer, and the second photoresist layer is not dissoluble in the first developer, and
wherein the second photoresist layer is dissoluble in a second developer.

26. The method of claim 25, wherein the first photoresist layer is not dissoluble in the second developer.

27. The method of claim 25, wherein the second photoresist layer is over the first photoresist layer.

\* \* \* \* \*